US012799143B2

(12) United States Patent
Romero et al.

(10) Patent No.: US 12,799,143 B2
(45) Date of Patent: Nov. 17, 2026

(54) METHODS AND SYSTEMS FOR FORMING A LAYER COMPRISING SILICON AND COMPOSITION AND SYNTHESIS OF SILICON PRECURSOR

(71) Applicant: ASM IP Holding B.V., Almere (NL)

(72) Inventors: Patricio Eduardo Romero, Wilsele (BE); René Henricus Jozef Vervuurt, Leuven (BE); Charles Dezelah, Helsinki (FI); Viljami J. Pore, Helsinki (FI)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 18/980,692

(22) Filed: Dec. 13, 2024

(65) Prior Publication Data

US 2025/0197431 A1 Jun. 19, 2025

Related U.S. Application Data

(60) Provisional application No. 63/560,233, filed on Mar. 1, 2024, provisional application No. 63/560,276, filed on Mar. 1, 2024, provisional application No. 63/560,303, filed on Mar. 1, 2024, provisional application No. 63/610,434, filed on Dec. 15, 2023.

(51) Int. Cl.
*C07F 9/06* (2006.01)
*C23C 16/24* (2006.01)
*C23C 16/455* (2006.01)

(52) U.S. Cl.
CPC ................ *C07F 9/06* (2013.01); *C23C 16/24* (2013.01); *C23C 16/4554* (2013.01)

(58) Field of Classification Search
CPC ....... C23C 16/22; C23C 16/24; C23C 16/325; C23C 16/345
See application file for complete search history.

(56) References Cited

U.S. PATENT DOCUMENTS 4,910,153 A * 3/1990 Dickson ................ H10F 71/103 136/258
6,432,839 B2 8/2002 Maeda
11,049,714 B2 6/2021 MacDonald et al.
2003/0068851 A1 4/2003 Todd
2004/0231799 A1 11/2004 Lee et al.
2005/0109276 A1 5/2005 Iyer et al.
2006/0148271 A1 7/2006 Borovik et al.
2010/0012030 A1 1/2010 Todd et al.
2015/0147824 A1 5/2015 Cameron et al.
2015/0206719 A1 7/2015 Swaminathan et al.
2017/0342559 A1 11/2017 Fukazawa et al.
2021/0171551 A1 6/2021 Takubo et al.
2021/0188885 A1 6/2021 Geeson et al.
2022/0267903 A1 8/2022 Lee
2023/0411147 A1 12/2023 Jeon

FOREIGN PATENT DOCUMENTS

WO 2023121973 A1 6/2023
WO 2023121976 A1 6/2023

OTHER PUBLICATIONS

Chlorosilane-chemspider (https://www.chemspider.com/Chemical-Structure.55530.html; downloaded Jun. 4, 2025).*
Trimethylchlorosilane-PubChem (https://pubchem.ncbi.nlm.nih.gov/compound/trimethylchlorosilane; downloaded Jun. 4, 2025).*
Tris(trimethylsilyl)phosphine-Sigma (https://www.sigmaaldrich.com/US/en/product/aldrich/333670?utm_source=pubchem&utm_campaign=pubchem_2017&utm_medium=referral; downloaded Jun. 4, 2025).*
Chandrasiri et al.. Sterically Encumbered Tris(trialkylsilyl) Phosphine Precursors for Quantum Dot Synthesis. Inorganic Chemistry. vol. 59. No. 21. Oct. 11, 2020 [retrieved on Jan. 13, 2025]. Retrieved from the internet: <URL: https://pubs.acs.org/doi/abs/10.1021/acs.inorgchem.0c02440>.
Levy et al. Low-pressure chemical vapor deposition of silicon dioxide using diethylsilane, Chem. Mater., Dec. 1, 1993, 5 (12), 1710-1714. Abstract; p. 1713, col. 1, para 2.

* cited by examiner

*Primary Examiner* — Pancham Bakshi
(74) *Attorney, Agent, or Firm* — Banner & Witcoff, Ltd.

(57) ABSTRACT

Disclosed are methods and systems for forming a silicon-containing layer on a substrate. Further disclosed are composition and synthesis of silicon-containing precursor. The methods for forming a silicon-containing layer comprise executing a plurality of deposition cycles. A deposition cycle comprises a first precursor pulse that comprises exposing the substrate to a first precursor. The first precursor comprises a molecule comprising a P—Si bond. A deposition cycle further comprises a plasma pulse that comprises exposing the substrate to a plasma treatment. The plasma treatment comprises generating a plasma.

16 Claims, 9 Drawing Sheets

METHODS AND SYSTEMS FOR FORMING A LAYER COMPRISING SILICON AND COMPOSITION AND SYNTHESIS OF SILICON PRECURSOR

CROSS-REFERENCE TO RELATED APPLICATIONS

This Application claims the benefit of U.S. Provisional Application 63/610,434 filed on Dec. 15, 2023, U.S. Provisional Application 63/560,233 filed on Mar. 1, 2024, U.S. Provisional Application 63/560,276 filed on Mar. 1, 2024, and U.S. Provisional Application 63/560,303 filed on Mar. 1, 2024, the entire contents of each of which are incorporated herein by reference.

FIELD OF INVENTION

The present disclosure generally relates to the field of semiconductor processing methods and systems, and to the field integrated circuit manufacture. In particular, methods and systems suitable for forming layers comprising silicon are disclosed.

BACKGROUND OF THE DISCLOSURE

As integrated circuits continue to scale, and 3D integration of integrated circuits becomes a reality, there is an increased need for silicon-containing materials having excellent conformality and improved material properties such as dielectric constant, resistivity, and wet etch rate resistance. There is additionally an increased need for silicon-containing materials that can be formed using low-temperature processes, such as processes that operate at temperatures of at most 400° C., or at most 300° C., or at most 200° C. For example, there is a need for conformal silicon nitride (SiN) low-k spacers with high conformality, low leakage, low dielectric constant, and excellent wet etch resistance.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Various embodiments of the present disclosure relate to methods of depositing a material comprising silicon, to structures and devices formed using such methods, and to apparatus for performing the methods and/or for forming the structures and/or devices. The layers may be used in a variety of applications, including etch stop layers, back-end-of-line dielectrics, capping layers, spacers, and others.

Described herein is a method for depositing a silicon-containing layer on a substrate in a reaction chamber. The method comprises providing a first precursor in vapor phase into the reaction chamber, and providing a nitrogen-containing reactive species into the reaction chamber. The first precursor has a general formula $$PX_n(SiR_3)_{3-n}$$

wherein P is phosphorus;

Si is silicon bonded to phosphorus by a Si—P bond;

n is an integer having the value of 0, 1 or 2;

X is a substituent bonded to phosphorus selected from the group consisting of hydrocarbyl group, halogen, hydrogen, amino group, alkoxy group, alkyl group and aryl group; and R is a substituent that is attached to Si selected from the group consisting of hydrogen, halogen, hydrocarbyl group, alkoxy group, silyl group, alkyl group and aryl group.

Each of R and X can be independently selected from the groups described above.

In some embodiments, the reactive species is generated by a plasma from a reactant.

In some embodiments, the reactive species comprises at least one compound selected from the group consisting of nitrogen, nitrogen atoms, nitrogen plasma, nitrogen radicals, N*, NH* and $NH_2$* radicals.

In some embodiments, the reactive species are generated directly above the substrate.

In some embodiments, the reactive species are generated away from the substrate.

In some embodiments, a remote plasma generator is used for generating the reactive species.

In some embodiments, the first precursor is selected from the group consisting of trisilyl phosphine, tris(trimethylsilyl) phosphine, silylphosphine, disilylphosphine, bis(disilanyl) phosphine, disilanylphosphine, tris(trisilanyl)phosphine, bis (trisilanyl)phosphine, trisilanylphosphine, dichlorosilylphosphine, chlorodisilylphosphine, bis(disilanyl)chlorophosphine, disilanyldichlorophosphine, trisilanyldichlorophosphine, bis(trisilanyl)chlorophosphine, dimethylsilylphosphine, disilylmethylphosphine, bis(disilanyl) methylphosphine, disilanyldimethylphosphine, trisilanyldimethylphosphine, and bis(trisilanyl)methylphosphine.

In some embodiments, the silicon-containing layer is selected from the group consisting of silicon nitride, silicon oxide, silicon carbon nitride, silicon oxynitride and silicon oxycarbon nitride.

In some embodiments, the silicon-containing layer is formed on a three dimensional structure.

Further described herein is a method for depositing a silicon-containing layer on a substrate in a reaction chamber, comprising:

providing a silicon precursor in vapor phase into the reaction chamber;

providing a phosphorus precursor in vapor phase into the reaction chamber; and providing a nitrogen-containing reactive species into the reaction chamber.

In some embodiments, the silicon precursor comprises silicon and a substituent selected from the group consisting of hydrogen, halogen and nitrogen-containing substituent. In some embodiments, the nitrogen-containing substituent is selected from the group consisting of amino group, alkyl amino group and dialkyl amino group.

In some embodiments, the silicon precursor is selected from the group consisting of $SiH_4$, $Si_2H_6$, $Si_3H_8$, cyclopentasilane, cyclohexasilane, neopentasilane, $SiH_3Cl$, $SiH_2Cl_2$, $SiHCl_3$, $SiCl_4$, $SiH_3Br$, $SiH_2Br_2$, $SiHBr_3$, $SiBr_4$, $SiH_3I$, $SiH_2I_2$, $SiHI_3$, $SiI_4$, $Si(NMe_2)_4$, $SiH(NMe_2)_3$, $SiCl(NMe_2)_3$, $Si(NH_2)(NMe_3)_3$, $SiH_2(NEt_2)_2$, $SiH_2(NHtBu)_2$, $SiH_3[N(iPr_2)]$, $SiH_3[N(sBu_2)]$, $N(SiH_3)_3$, $N(SiMe_3)_3$, $NH(SiH_3)_2$, $NH(SiMe_3)_2$ $Si_2(NHEt)_6$, $NH[SiH_2N(SiH_3)_2]_2$, $SiH_2[N(SiH_3)_2]_2$, In some embodiments, the phosphorus precursor comprises phosphorus and substituent selected from the group consisting of hydrogen, halogen and nitrogen-containing substituent. In some embodiments, the nitrogen-containing substituent is selected from the group consisting of amino group, alkyl amino group and dialkyl amino group.

In some embodiments, the phosphorus precursor is selected from the group consisting of $PH_3$, $tBuPH_2$, $EtPH_2$, phenylphosphine, 1,2-diphosphinoethane, (2-methylpropyl) phosphine, cyclohexylphosphine and 1,2-diphosphinobenzene, $PCl_3$, $PCl_5$, $PBr_3$, $PBr_5$, $PI_3$, $MePCl_2$, $EtPCl_2$, $PrPCl_2$, $iPrPCl_2$, $BuPCl_2$, $tBuPCl_2$, $tBu_2PCl$, $iPr_2PCl$, $Et_2PCl$, $Me_2PCl$, $sBu_2PCl$, tBuMePCl, $tBu_2PBr$, $P(NMe_2)_3$, $PH(NMe_2)_2$, $PH_2(NMe_2)$, $P(NEt_2)_3$, $PCl_2(NEt_2)$, $PCl[N(iPr)_2]2$, tris(N-pyrrolidinyl)phosphine, $PCl(NEt_2)_2$, $PCl_2(NMe_2)$, $PCl_2[N(iPr)_2]$, $P(=NH)(NMe_2)_3$, $PCl(NMe_2)_2$, and $PMe(NMe_2)_2$.

In some embodiments, the nitrogen-containing reactive species comprises at least one compound selected from the group consisting of nitrogen, nitrogen atoms, nitrogen plasma, nitrogen radicals, N*, NH* and NH2* radicals.

Further described herein is a layer formed by the method described above.

In some embodiments, the layer comprises less than 4 atomic-% of phosphorus impurity.

In some embodiments, the layer has a wet etch rate of less than 1.5 nm/min in 1.5% dilute hydrofluoric acid.

In some embodiments, the layer has growth rate of 0.3 to 2.0 Å per cycle.

In some embodiments, the layer has a step coverage of more than about 80%.

In some embodiments, the layer has a step coverage of more than about 90%.

Further described herein is a layer comprising silicon obtained by depositing a precursor having a structure according to the general formula:

$$PX_n(SiR_3)_{3-n}$$

wherein P is phosphorus;

Si is silicon bonded to phosphorus by a Si—P bond;

n is an integer having the value of 0, 1 or 2; and

X is a substituent bonded to phosphorus selected from the group consisting of hydrocarbyl group, halogen, hydrogen, amino group, alkoxy group alkyl group and aryl group; and R is a substituent that is attached to Si selected from the group consisting of hydrogen, halogen, hydrocarbyl group, alkoxy group, silyl group alkyl group and aryl group.

Each of R and X can be independently selected from the groups described above.

Further described herein is a composition configured for depositing an amorphous silicon and non-metal-containing layer by PEALD. The composition comprises a chemical precursor having a structure according to the general formula:

$$PX_n(SiR_3)_{3-n}$$

wherein P is phosphorus;

Si is silicon bonded to phosphorus by a Si—P bond;

n is an integer having the value of 0, 1 or 2; and

X is a substituent bonded to phosphorus selected from the group consisting of hydrocarbyl group, halogen, hydrogen, amino group, alkoxy group alkyl group and aryl group; and R is a substituent that is attached to Si selected from the group consisting of hydrogen, halogen, hydrocarbyl group, alkoxy group, silyl group alkyl group and aryl group.

Each of R and X can be independently selected from the groups described above. The composition has a purity of less than 99.9 (w/w %); and comprises more than 1 ppm (w/w %) of at least one impurity selected from the list consisting of oxygen-containing, carbon-containing, nitrogen-containing, sulfur-containing and metal-containing impurity.

In one aspect the disclosure relates to composition comprising trisilylphosphine and impurities wherein the composition has a purity of less than 99.99 (w/w %) of trisilylphosphine and wherein the composition comprises more than 1 ppb (w/w %) of at least one impurity selected from the list consisting of oxygen-containing, carbon-containing, nitrogen-containing, sulfur-containing, metal-containing impurity and halogen-containing.

In some embodiments, the composition further comprises from about 0.01 wt-% to about 10 wt-% solvent as impurity, and wherein the solvent is selected from at least one of the group consisting of pentane, hexane, cyclohexane, benzene, toluene, xylene, diethyl ether, methyl tert-butyl ether, tetrahydrofuran, 1,4-dioxane, acetonitrile, chloroform, dichloromethane, carbon tetrachloride, triethyl amine, pyridine, ethyl acetate, 1,2-dimethoxyethane, dimethyl sulfoxide, 1,2-dichloroethane, chlorobenzene, acetone, 2-butanone, and species thereof.

In some embodiments, the composition comprises from about 0.01 wt-% to about 10 wt-% species impurities, and wherein the species impurities are selected from the group consisting of $P(SiMe_3)_3$, $SiH_3Cl$, $SiH_2Cl_2$, $SiHCl_3$, $SiCl_4$, $SiHMe_3$, $SiClMe_3$, $P(SiH_3)(SiMe_3)_2$, $P(SiH_3)_2(SiMe_3)$, $PCl(SiH_3)_2$, $PCl_2(SiH_3)$, $PCl(SiMe_3)_2$, $PCl_2(SiMe_3)$, $PCl_3$, $PH(SiH_3)_2$, $PH_2(SiH_3)$, $PH(SiMe_3)_2$, and $PH_2(SiMe_3)$.

In some embodiments, the composition does not comprise any impurities selected from the group consisting of $P(SiMe_3)_3$, $SiH_3Cl$, $SiH_2Cl_2$, $SiHCl_3$, $SiCl_4$, $SiHMe_3$, $SiClMe_3$, $P(SiH_3)(SiMe_3)_2$, $P(SiH_3)_2(SiMe_3)$, $PCl(SiH_3)_2$, $PCl_2(SiH_3)$, $PCl(SiMe_3)_2$, $PCl_2(SiMe_3)$, $PCl_3$, $PH(SiH_3)_2$, $PH_2(SiH_3)$, $PH(SiMe_3)_2$, and $PH_2(SiMe_3)$.

In some embodiments, the composition does not comprise group IV halide. In some embodiments, the group IV element in the group IV halide is selected from the list tin, germanium and silicon.

In some embodiments, the composition does not comprise phosphorus-hydrogen bond. In some embodiments, the composition does not comprise silyl chloride.

In some embodiments, the composition comprises from about 0.01 wt-% to about 10 wt-% species impurities, and wherein the species impurities are selected from the group consisting of $P(OSiMe_3)_x(SiMe_3)_y$, $P(OSiMe_3)_x(SiH_3)_y$, $P(OSiH_3)_x(SiH_3)_y$, and $P(OSiH_3)_x(SiMe_3)_y$, where x=1 to 3 and where x+y=3.

In some embodiments, the composition comprises from about 0.01 wt-% to about 10 wt-% species impurities, and wherein the species impurities are selected from the group consisting of $PH_x(OSiMe_3)_y(SiMe_3)_z$, $PH_x(OSiMe_3)_y$ $(SiH_3)_z$, $PH_x(OSiH_3)_y(SiH_3)_z$, and $PH_x(OSiH_3)_y(SiMe_3)_z$, where x=1 or 2, and where y=1 or 2, where z=0 or 1, and where x+y+z=3.

In some embodiments, the composition comprises from about 0.01 wt-% to about 10 wt-% species impurities, and wherein the species impurities are selected from the group consisting of $P(Hal)_x(OSiMe_3)_y(SiMe_3)_z$, $P(Hal)_x(OSiMe_3)_y(SiH_3)_z$, $P(Hal)_x(OSiH_3)_y(SiH_3)_z$, and $P(Hal)_x(OSiH_3)_y(SiMe_3)_z$, where x=1 or 2, and where y=1 or 2, where z=0 or 1, and where x+y+z=3, and where "Hal" is a halogen substituent selected from F, Cl, Br, and I.

In some embodiments, the composition comprises more than about 100 ppb of moisture as impurity.

In some embodiments, the layer comprises silicon nitride, silicon carbide, silicon oxide or mixtures thereof.

One aspect of the present disclosure relates to a composition comprising molecule having P and at least one Si connected to P and impurities wherein the composition has purity of less than 99.999 (w/w %) of the said molecule and wherein the composition comprises impurities of oxygen, carbon, nitrogen, sulfur or metal more than 1 ppm (w/w %) and wherein the molecule does contain only atoms selected from P, Si, H, or halides selected from F, Cl, Br and I.

One aspect of the present disclosure relates to a composition comprising molecule having P and at least one Si connected to P and impurities, wherein the composition has purity of less than 99.999 (w/w %) of the said molecule and wherein the composition comprises impurities of oxygen, nitrogen, sulfur or metal more than 1 ppm (w/w %) and wherein the molecule does contain only atoms selected from P, Si, H, C or halides selected from F, Cl, Br and I.

Another aspect of the present disclosure relates to a method for making a chemical precursor having a structure according to the general formula:

PXn(SiR3)3-n wherein P is phosphorus;

Si is silicon bonded to phosphorus by a Si—P bond;

n is an integer having the value of 0, 1 or 2; and

X is a substituent bonded to phosphorus selected from the group consisting of hydrocarbyl group, halogen, hydrogen, amino group, alkoxy group, alkyl group and aryl group; and R is a substituent that is attached to Si selected from the group consisting of hydrogen, halogen, hydrocarbyl group, alkoxy group, silyl group, alkyl group and aryl group;

wherein each X and R is selected independently, wherein the method comprises the steps of forming an intermediate product; and forming the chemical precursor wherein the intermediate product comprises at least one aromatic group.

In some embodiments, the step of forming the intermediate product comprises a) reacting a starting product comprising silicon which is bonded to a halogen atom and aromatic group with alkali metal atom, wherein the halogen atom is replaced with the alkali metal atom; and b) after the reaction of a) is completed, reacting the molecule with phosphorous halide, wherein alkali metal is replaced with phosphorous atom.

In some embodiments, the step of forming the chemical precursor comprises c) reacting the intermediate molecule with TfOH, wherein the aromatic group is replaced with OTf group; and c) after the reaction of c) is completed, reacting the molecule with alkali metal hydride, wherein the OTf group is replaced with hydrogen, wherein a chemical precursor is formed.

In some embodiments, the step of forming the chemical precursor comprises c) reacting the intermediate molecule with TfOH, wherein the phenyl group is replaced with OTf group; and d) after the reaction of c) is completed, reacting the molecule with MX, wherein the OTf group is replaced with X, wherein X is selected from the group consisting of Cl, Br, I and alkyl group, wherein M is selected from the group consisting of Li, Na, K, Rb, Cs, Mg, Ca and $NR_4$, wherein R is selected from the group consisting of hydrogen, halogen, hydrocarbyl group, alkoxy group, silyl group, alkyl group and aryl group, and wherein a chemical precursor is formed.

In some embodiments, the chemical precursor has the general formula of

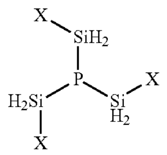

wherein X is selected from the group consisting of Cl, Br, I and H, alkyl group.

In some embodiments, the chemical precursor comprises trisilylphosphine.

In some embodiments, the intermediate molecule comprises 1,3-diphenyl-2-(phenylsilyl)disilaphosphane.

In some embodiments, the starting product comprises chloro(phenyl)silane.

In some embodiments, the step of forming the intermediate product is performed in a first reaction chamber.

In some embodiments, the step of forming the chemical precursor is performed in a second reaction chamber.

In some embodiments, during the step of forming the intermediate product the reaction chamber is cooled or heated or kept at room temperature.

In some embodiments, during the step of forming the chemical precursor the reaction chamber is cooled or heated or kept at room temperature.

In some embodiments, during the forming of the intermediate product and the chemical precursor the process steps are performed under continuous mixing.

Another aspect of the present disclosure relates to a vapor delivery vessel comprising the film forming composition for depositing an amorphous silicon and non-metal-containing layer by PEALD. The vapor delivery vessel comprises an outer wall that encloses a cavity for storing the film forming composition and a gas outlet for allowing a vapor of the film forming composition to exit the cavity. A vessel comprising a chemical precursor having a structure according to the general formula:

$$PX_n(SiR_3)_{3-n}$$

wherein P is phosphorus;

Si is silicon bonded to phosphorus by a Si—P bond;

n is an integer having the value of 0, 1 or 2; and

X is a substituent bonded to phosphorus selected from the group consisting of hydrocarbyl group, halogen, hydrogen, amino group, alkoxy group alkyl group and aryl group; and R is a substituent that is attached to Si selected from the group consisting of hydrogen, halogen, hydrocarbyl group, alkoxy group, silyl group alkyl group and aryl group.

The vessel is configured to supply a vapor of the chemical precursor to a semiconductor processing apparatus chamber.

Each of R and X can be independently selected from the groups described above. The composition has a purity of less than 99.9 (w/w %); and the composition comprises more than 1 ppm (w/w %) of at least one impurity selected from the list of oxygen-containing, carbon-containing, nitrogen-containing, sulfur-containing and metal-containing impurity.

In some embodiments, the vapor delivery vessel further comprises a gas inlet and a conduit that extends into the cavity to a fixed point. The conduit may extend into the cavity and into the film forming composition for passing a carrier gas through the film forming composition. Alternatively, the conduit may extend into the cavity to a point that is above the film forming composition for passing a carrier gas over the surface of the film forming composition.

In some embodiments, the vapor delivery vessel further comprises a probe member. The probe member may comprise one or more temperature sensors and/or one or more level sensors and one or more pressure sensors.

In some embodiments, the outer wall and the cavity of the vapor delivery vessel are formed from stainless steel. In some embodiments, the vessel is suitable to be attached to a vapor deposition reactor.

Further described herein is a semiconductor processing apparatus. The apparatus comprises a reaction chamber comprising a substrate support for supporting a substrate, a heater constructed and arranged to heat the substrate in the reaction chamber, a plasma module comprising a radio frequency power source constructed and arranged to generate a plasma, a plasma gas source in fluid communication with the plasma module, a first precursor source in fluid connection with the reaction chamber via one or more precursor valves, and a controller configured for causing the semiconductor processing apparatus to perform a method to a method described above.

Further described herein is a semiconductor processing apparatus. The apparatus comprises a reaction chamber comprising a substrate support for supporting a substrate, a heater constructed and arranged to heat the substrate in the reaction chamber, a plasma module comprising a radio frequency power source constructed and arranged to generate a plasma, a plasma gas source in fluid communication with the plasma module, a silicon precursor source in fluid connection with the reaction chamber via one or more precursor valves, a phosphorus precursor source in fluid connection with the reaction chamber via one of more precursor valves, and a controller configured for causing the semiconductor processing apparatus to perform a method described above.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
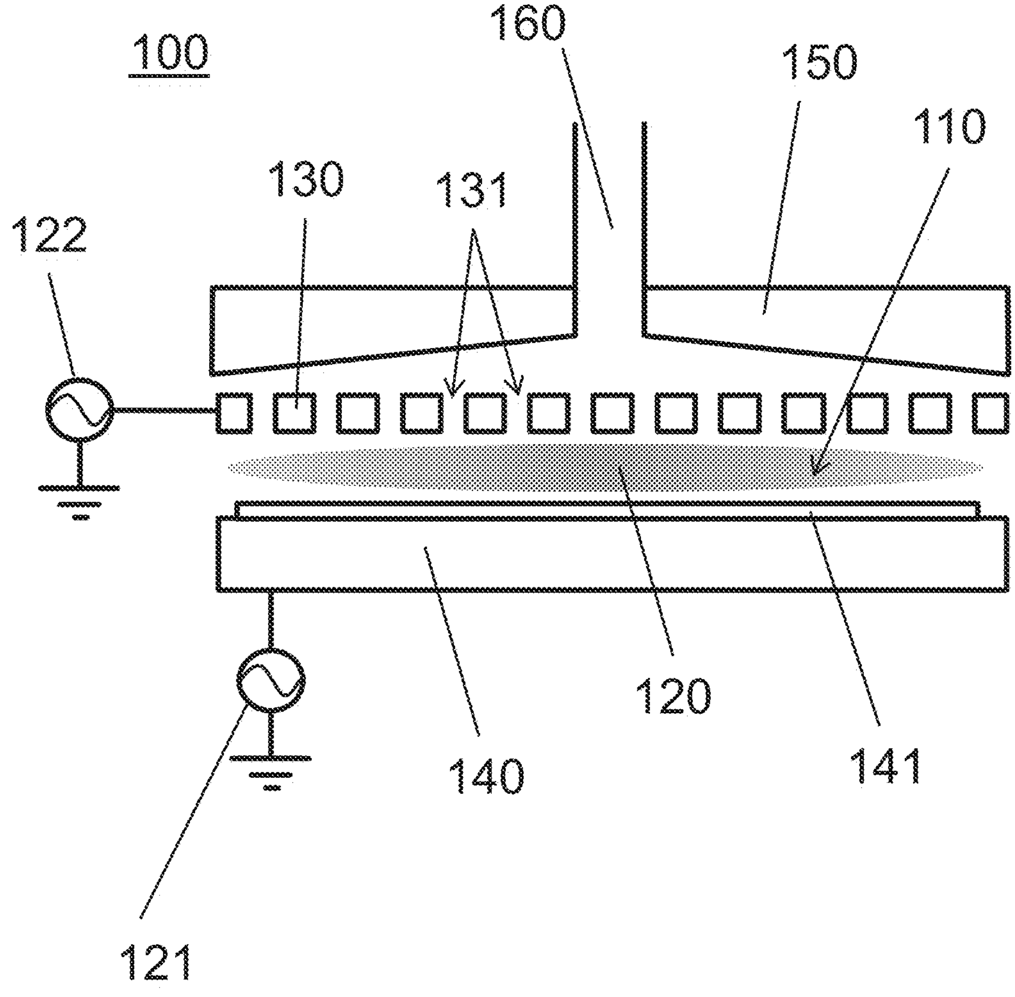
FIG. 1 shows a schematic representation of an embodiment of a system as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. Exemplary gasses can include precursors and reactants.

As used herein, the term "comprising" indicates that certain features are included, but that it does not exclude the presence of other features, as long as they do not render the claim or embodiment unworkable. In some embodiments, the term "comprising" includes "consisting". As used herein, the term "consisting" indicates that no further features are present in the apparatus/method/product apart from the ones following said wording. When the term "consisting" is used referring to a chemical compound or substance, it indicates that the chemical compound only contains the components which are listed.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material. Additionally or alternatively, an exemplary substrate can comprise bulk semiconductor material and a conductive layer overlying at least a portion of the bulk semiconductor material.

As used herein, "step coverage" refers to the growth rate of a layer on a distal end relative to the opening of a recess, divided by the growth rate of that layer on a proximal end relative to the opening of the recess, expressed as a percentage. Step coverage provides a measure of the conformity of a layer.

As used herein, a "vapor delivery vessel" refers to a vessel that is suitable for or configured for vapor delivery of a substance that is contained within the vessel. The vapor delivery vessel comprises an outer wall that encloses a cavity for storing and/or holding the substance and a fluid outlet for allowing a vapor of the substance to exit the cavity. The substance contained within the cavity may be a composition that is suitable for vapor deposition or etch methods. For example, the substance contained within the cavity may comprise one or more precursors, one or more reactants, one or more etchants, or one or more surface treatment agents, as applicable. The substance contained within the cavity may be a homogeneous or heterogenous mixture. The substance contained within the cavity may be in a solid form, a liquid form, a gaseous form, or a combination thereof. The vapor delivery vessel may be a vapor draw vessel, a carrier gas vessel, a double walled vessel, a sublimation vessel, and/or other configuration.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or include a substrate as described herein. Structures can include one or more layers overlying the substrate, such as one or more layers formed according to a method as described herein. Device portions and interconnects can be or include structures.

The term "deposition process" as used herein can refer to the introduction of precursors (and/or reactants) into a reaction chamber to deposit a layer over a substrate. "Cyclical deposition processes" are examples of "deposition processes".

The term "cyclic deposition process" or "cyclical deposition process" can refer to the sequential exposure of a substrate to precursors (and/or reactants) into a reaction chamber, and exposure of a substrate to plasma generated species to deposit a layer over the substrate and includes processing techniques such as plasma-enhanced atomic layer deposition (PEALD).

The term "plasma-enhanced atomic layer deposition" can refer to a deposition process in which deposition cycles, typically a plurality of consecutive deposition cycles, are conducted in a process chamber.

Generally, for a PEALD processes, during each cycle, a precursor is introduced to a reaction chamber and is chemisorbed to a deposition surface (e.g., a substrate surface that can include a previously deposited material from a previous PEALD cycle or other material) and forming about a monolayer or sub-monolayer of material that does not readily react with additional precursor (i.e., a self-limiting reaction). Thereafter, the substrate is exposed to a plasma-generated species which can be generated using any plasma, such as a direct, indirect, or remote plasma. Plasmas can be generated capacitively, inductively, using microwave radiation, or through other means. The plasma-generated species converts the chemisorbed precursor to the desired material on the deposition surface. Purging steps can be utilized during one or more cycles, e.g., after each step or pulse of each cycle, to remove any excess precursor from the process chamber and/or remove any excess plasma-generated species and/or reaction byproducts from the reaction chamber.

As used herein, the term "purge" may refer to a procedure in which a purge gas is provided to a reaction chamber in between a precursor pulse and a plasma pulse or between a precursor pulse and a reactant pulse. It shall be understood that during a purge, the substrate is not exposed to plasma-generated species. For example, when a direct plasma is used, the plasma can be turned off during a purge. For example, a purge, e.g. using a purge gas such as nitrogen or a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

The standard abbreviations of the elements in the periodic table are used herein. For example, "P" refers to phosphorous, "Si" refers to silicon, "H" refers to hydrogen, "C" refers to carbon, and "N" refers to nitrogen, and "Li" refers to lithium. Additionally, in certain places throughout the disclosure, the following abbreviations of chemical structures or groups are used: "Me" stands for methyl ($—CH_3$); "Et" stands for ethyl ($—CH_2CH_3$); "nPr" stands for n-propyl ($—CH_2CH_2CH_3$); "iPr" stands for iso-propyl ($—CH(CH_3)_2$); "nBu" stands for n-butyl ($—CH_2CH_2CH_2CH_3$); "sBu" stands for sec-butyl ($—CH(CH_3)CH_2CH_3$), "iBu" stands for iso-butyl ($—CH_2CH(CH_3)CH_3$), "tBu" stands for tert-butyl ($—C(CH_3)_3$); and "Ph" stands for phenyl ($—C_6H_5$).

In this disclosure, any defined meanings do not necessarily exclude ordinary and customary meanings, in some embodiments.

Described herein is a method that can be employed for forming a silicon-containing material on a substrate. A monocrystalline silicon wafer may be a suitable substrate. Other substrates may be suitable as well, e.g. monocrystalline germanium wafers, gallium arsenide wafers, quartz, sapphire, glass, steel, aluminum, silicon-on-insulator substrates, plastics, etc. A substrate can comprise a surface layer on which a layer deposited by means of a method as described herein is formed. Suitable surface layer include conductive layers such as metals or certain nitrides. A suitable nitride includes titanium nitride. Other suitable surface layers include high-k dielectric layers such as hafnium oxide. In some embodiments the substrate comprises a hydroxyl-terminated surface. In other words, in some embodiments, the substrate comprises OH groups on its surface. This can advantageously improve silicon-containing layer depositions using the methods as described herein.

The method comprises positioning a substrate on a substrate support in a reaction chamber. Then, the method comprises executing a plurality of deposition cycles. A deposition cycle comprises a first precursor pulse and a plasma pulse. A first precursor pulse comprises exposing the substrate to a first precursor. The plasma pulse can suitably comprise exposing the substrate to a plasma treatment. Thus, a layer comprising silicon is formed on the substrate.

It shall be understood that the first precursor pulses and the plasma pulses are executed sequentially, i.e. one after the other, in a non-overlapping fashion. Optionally, the purges are carried out in between the first precursor pulses and the plasma pulses.

In some embodiments, the first precursor pulses and the plasma pulses are executed nonsequentially, i.e. so the pulses overlap and there is no purges between the pulses. Optionally, there may be purge pulse after a deposition cycle. In other words, one or more deposition cycles comprising a precursor pulse and a plasma pulse can be executed followed by a purge pulse.

The layer comprising silicon can consist of, or can consist substantially of silicon. In other embodiments, the layer comprising silicon comprises one or more additional elements such as oxygen, carbon, and nitrogen. Thus, the layer comprising silicon can, in some embodiments, comprise one or more of silicon oxide, amorphous silicon, poly silicon, silicon carbide, silicon nitride, silicon oxycarbide, silicon oxynitride, silicon carbonitride, and silicon oxycarbonitride.

In some embodiments, the layer comprising silicon comprises silicon nitride.

In some embodiments, the layer is formed on a three-dimensional structure, for example a trench structure.

In some embodiments, the first precursor has a general formula of $$PX_n(SiR_3)_{3-n}$$

wherein P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently.

In some embodiments, X is selected from the group consisting of hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluoro, chloro, bromo, iodo, amino, dimethylamino, diethylamino, ethylmethylamino, diisopropylamino, tert-butylamino, methoxy, ethoxy, n-propoxy, isopropoxy, n-butoxy, sec-butoxy and tert-butoxy.

In some embodiments, R is hydrogen. In some embodiments, R is a halogen selected from F, Cl, Br, or I. In some embodiments, R is a hydrocarbyl group comprising one to ten carbon atoms. In some embodiments, R is an alkoxy group comprising one to six carbon atoms. In some embodiments, R is a silyl, disilyl, or trisilyl group. In some embodiments, R groups are selected independently from the following: hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluorine, chlorine, bromine, iodine, methoxy, ethoxy, n-propoxy, isopropoxy, n-butoxy, sec-butoxy, tert-butoxy, —SiH3, —Si2H5, or —Si3H7.

In some embodiments, the first precursor has a structure according to the formula i)

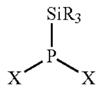

i)

wherein P is phosphorus, Si is silicon bonded to phosphorus by a Si—P bond, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group.

In some embodiments, X is selected from the group consisting of hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluoro, chloro, bromo, iodo, amino, dimethylamino, diethylamino, ethylmethylamino, diisopropylamino, tert-butylamino, methoxy, ethoxy, n-propoxy, isopropoxy, n-butoxy, sec-butoxy and tert-butoxy.

In some embodiments, R is hydrogen. In some embodiments, R is a halogen selected from F, Cl, Br, or I. In some embodiments, R is a hydrocarbyl group comprising one to ten carbon atoms. In some embodiments, R is an alkoxy group comprising one to six carbon atoms. In some embodiments, R is a silyl, disilyl, or trisilyl group. In some embodiments, R groups are selected independently from the following: hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluorine, chlorine, bromine, iodine, methoxy, ethoxy, n-propoxy, isopropoxy, n-butoxy, sec-butoxy, tert-butoxy, —SiH3, —Si2H5, or —Si3H7.

In some embodiments, the first precursor has a structure according to the formula ii)

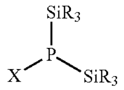

ii)

wherein P is phosphorus, Si is silicon bonded to phosphorus by a Si—P bond, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently.

In some embodiments, X is selected from the group consisting of hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluoro, chloro, bromo, iodo, amino, dimethylamino, diethylamino, ethylmethylamino, diisopropylamino, tert-butylamino, methoxy, ethoxy, n-propoxy, isopropoxy, n-butoxy, sec-butoxy and tert-butoxy.

In some embodiments, R is hydrogen. In some embodiments, R is a halogen selected from F, Cl, Br, or I. In some embodiments, R is a hydrocarbyl group comprising one to ten carbon atoms. In some embodiments, R is an alkoxy group comprising one to six carbon atoms. In some embodiments, R is a silyl, disilyl, or trisilyl group. In some embodiments, R groups are selected independently from the following: hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluorine, chlorine, bromine, iodine, methoxy, ethoxy, n-propoxy, isopropoxy, n-butoxy, sec-butoxy, tert-butoxy, —SiH3, —Si2H5, or —Si3H7.

In some embodiments, the first precursor has a structure according to the formula iii)

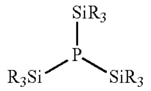

iii)

wherein P is phosphorus, Si is silicon bonded to phosphorus by a Si—P bond, R is a substituent that is attached to Si selected from the group consisting of hydrogen, halogen, hydrocarbyl group, alkoxy group, silyl group, alkyl group and aryl group. Each R is selected independently.

In some embodiments, R is hydrogen. In some embodiments, R is a halogen selected from F, Cl, Br, or I. In some embodiments, R is a hydrocarbyl group comprising one to ten carbon atoms. In some embodiments, R is an alkoxy group comprising one to six carbon atoms. In some embodiments, R is a silyl, disilyl, or trisilyl group. In some embodiments, R groups are selected independently from the following: hydrogen, methyl, ethyl, n-propyl, isopropyl, n-butyl, sec-butyl, tert-butyl, isobutyl, n-pentyl, 2-pentyl, 3-pentyl, isopentyl, tert-pentyl, cyclopentyl, n-hexyl, 2-hexyl, 3-hexyl, cyclohexyl, phenyl, fluorine, chlorine, bromine, iodine, methoxy, ethoxy, n-propoxy, isopropoxy, n-butoxy, sec-butoxy, tert-butoxy, —SiH3, —Si2H5, or —Si3H7.

In some embodiments, the first precursor comprises a molecule comprising a phosphorus atom bonded to three substituents. At least one of the substituents comprises a silicon atom. The possible other substituents are selected independently from the group consisting of hydrocarbyl group, halogen, hydrogen, amino group, alkoxy group, alkyl group and aryl group. The at least one silicon atom is further bonded to one or more substituents selected independently from the group consisting of hydrogen, halogen, hydrocarbyl group, alkoxy group, silyl group, alkyl group and aryl group.

In some embodiments, the first precursor is selected from the group consisting of trisilyl phosphine, tris(trimethylsilyl) phosphine, silylphosphine, disilylphosphine, bis(disilanyl) phosphine, disilanylphosphine, tris(trisilanyl)phosphine, bis (trisilanyl)phosphine, trisilanylphosphine, dichlorosilylphosphine, chlorodisilylphosphine, bis(disilanyl)chlorophosphine, disilanyldichlorophosphine, trisilanyldichlorophosphine, bis(trisilanyl)chlorophosphine, dimethylsilylphosphine, disilylmethylphosphine, bis(disilanyl)methylphosphine, disilanyldimethylphosphine, tri(disilanyl)phosphine, trisilanyldimethylphosphine, and bis(trisilanyl)methylphosphine.

A method as disclosed herein using trisilyl phosphine as a first precursor can advantageously result in a self-limiting plasma-enhanced atomic layer deposition (PEALD) process that shows self-limiting growth up to temperatures of 500° C. PEALD growth at such high temperatures can result in a very etch resistant silicon containing layer, a high growth-per-cycle and high conformality.

In some embodiments, the method described herein may be a chemical vapor deposition (CVD) process, or a plasma-enhanced chemical vapor deposition process (PECVD). In a CVD process, the precursors and/or reactants are fed into the reaction chamber at least partially simultaneously.

In some embodiments, a first precursor can be employed in an embodiment as described herein together with a nitrogen-containing reactive species to form a silicon-containing layer.

In some embodiments, the reactive species is generated by a plasma from a reactant, for example nitrogen-containing plasma.

In some embodiments, a first precursor pulse comprises a precursor sub-pulse and a precursor sub-purge. The precursor sub-pulse and the precursor sub-purge can be repeated for a pre-determined amount of times, e.g. from at least 1 to at most 10 times, until the precursor pulse ends.

Further described herein is a method for depositing a silicon-containing layer on a substrate in a reaction chamber. The method comprises providing a silicon precursor in vapor phase into the reaction chamber, providing a phosphorus precursor in vapor phase into the reaction chamber and providing a nitrogen-containing reactive species into the reaction chamber.

In some embodiments, the silicon precursor comprises silicon and at least one substituent selected from the group consisting of hydrogen, halogen and nitrogen-containing substituent. In some embodiments, the nitrogen-containing substituent is selected from the group consisting of amino group, alkyl amino group and dialkyl amino group. In some embodiments, the silicon precursor is selected from the group consisting of $SiH_4$, $Si_2H_6$, $Si_3H_8$, cyclopentasilane, cyclohexasilane, neopentasilane, $SiH_3Cl$, $SiH_2Cl_2$, $SiHCl_3$, $SiCl_4$, $SiH_3Br$, $SiH_2Br_2$, $SiHBr_3$, $SiBr_4$, $SiH_3I$, $SiH_2I_2$, $SiHI_3$, $SiI_4$, $Si(NMe_2)_4$, $SiH(NMe_2)_3$, $SiCl(NMe_2)_3$, $Si(NH_2)(NMe_3)_3$, $SiH_2(NEt_2)_2$, $SiH_2(NHtBu)_2$, $SiH_3[N(iPr_2)]$, $SiH_3[N(sBu_2)]$, $N(SiH_3)_3$, $N(SiMe_3)_3$, $NH(SiH_3)_2$, $NH(SiMe_3)_2$, $Si_2(NHEt)_6$, $NH[SiH_2N(SiH_3)_2]_2$, $SiH_2[N(SiH_3)_2]_2$.

In some embodiments, the phosphorus precursor comprises phosphorus, and substituent selected from the group consisting of hydrogen, halogen and nitrogen-containing substituent. In some embodiments, the nitrogen-containing substituent is selected from the group consisting of amino group, alkyl amino group and dialkyl amino group. In some embodiments, the phosphorus precursor is selected from the group consisting of $PH_3$, $^tBuPH_2$, $EtPH_2$, phenylphosphine, 1,2-diphosphinoethane, (2-methylpropyl)phosphine, cyclohexylphosphine and 1,2-diphosphinobenzene, $PCl_3$, $PCl_5$, $PBr_3$, $PBr_5$, $PI_3$, $MePCl_2$, $EtPCl_2$, $PrPCl_2$, $iPrPCl_2$, $BuPCl_2$, $^tBuPCl_2$, $^tBu_2PCl$, $^iPr_2PCl$, $Et_2PCl$, $Me_2PCl$, $^tBu_2PCl$, $^tBuMePCl$, $^tBu_2PBr$, $P(NMe_2)_3$, $PH(NMe_2)_2$, $PH_2(NMe_2)$, $P(NEt_2)_3$, $PCl_2(NEt_2)$, $PCl[N(iPr)_2]_2$, tris(N-pyrrolidinyl)phosphine, $PCl(NEt_2)_2$, $PCl_2(NMe_2)$, $PCl_2[N(iPr)_2]$, $P(NH)(NMe_2)_3$, $PCl(NMe_2)_2$, and $PMe(NMe_2)_2$.

In some embodiments, the plasma is a direct capacitively coupled plasma and a plasma pulse comprises a plasma on sub-pulse and a plasma off sub-pulse. During the plasma on sub pulse, the plasma is generated, and during the plasma off sub-pulse, plasma generation is stopped.

A plasma pulse can suitably comprise exposing the substrate to a plasma treatment. The plasma treatment comprises generating a plasma. The plasma can be one of a remote plasma, an indirect plasma, and a direct plasma.

Plasmas can be suitably generated by means of a plasma gas. Plasma gasses are gasses, vapors, gas mixtures, or a combination thereof that are provided to a space in which a plasma is generated. Suitable plasma gasses include $H_2$, $N_2$, and noble gasses such as He and Ar.

In some embodiments, the reactive species are generated directly above the substrate. In other words, the plasma is a direct capacitively coupled plasma generated between a showerhead injector and the substrate. In some embodiments, a direct capacitively coupled plasma can employ a plasma power from at least 175 W to at most 300 W, or to at most 1000 W.

In some embodiments, the reactive species comprises at least one compound selected from the group consisting of nitrogen, nitrogen atoms, nitrogen plasma, nitrogen radicals, N*, NH* and $NH_2$* radicals.

In some embodiments, the reactive species comprises at least one compound selected from the group consisting of oxygen, oxygen radicals, or other oxygen-containing reactive species.

In some embodiments, the reactive species does not comprise oxygen-containing reactive species or nitrogen-containing reactive species. In some embodiments, the reactive gas comprises hydrogen or a noble gas. In some embodiments, the noble gas may comprise argon.

In some embodiments, the plasma is $N_2$ plasma. In some embodiments, the plasma is an $H_2/N_2$-plasma. In some embodiments, the plasma is an ammonia plasma.

In some embodiments, the reactive species are generated away from the substrate. In some embodiments, a remote plasma generator is used for generating the reactive species.

In some embodiments, the substrate is maintained at a temperature of at least 100° C. to at most 600° C., or at a temperature of at least 300° C. to at most 500° C., or at a temperature of at least 300° C. to at most 400° C., or at a temperature of around 350° C. during the deposition cycles.

In some embodiments, the method comprises bringing the first precursor from a first precursor source to the reaction chamber. The first precursor source can be suitably maintained at a temperature of at least 20° C. to at most 200° C., or at least 20° C. to at most 100° C., or at a temperature of at least 30° C. to at most 80° C., or at a temperature of at least 40° C. to at most 60° C., for example at a temperature of 50° C.

In some embodiments, reaction chamber is maintained at a pressure of at least 10 Pa to at most 8000 Pa, at least 40 Pa to at most 2000 Pa, or at a pressure from at least 60 Pa to at most 1000 Pa, or at a pressure from at least 300 Pa to at most 3000 Pa, or at a pressure from at least 700 Pa to at most 2000 Pa.

The layer comprising silicon having a desired thickness can be formed on the substrate by executing a suitable number of deposition cycles. The total number of deposition cycles comprised in a method as described herein depends, inter alia, on the total layer thickness that is desired. In some embodiments, the method comprises from at least 2 deposition cycles to at most 5 deposition cycles, or from at least 5 deposition cycles to at most 10 deposition cycles, or from at least 10 deposition cycles to at most 20 deposition cycles, or from at least 20 deposition cycles to at most 50 deposition cycles, or from at least 50 deposition cycles to at most 100 deposition cycles, or from at least 100 deposition cycles to at most 200 deposition cycles, or from at least 200 deposition cycles to at most 500 deposition cycles, or from at least 500 deposition cycles to at most 1000 deposition cycles, or from at least 1000 deposition cycles to at most 2000 deposition cycles, or from at least 2000 deposition cycles to at most 5000 deposition cycles, or from at least 5000 deposition cycles to at most 10000 deposition cycles. For example, the layer comprising silicon can have a thickness of at least 1 nm to at most 20 nm, or at least 2 nm to at most 50 nm, such as a thickness of 2 nm, 5 nm, 10 nm, and 15 nm.

Thus, a silicon-containing material can be formed that has a thickness of e.g. 0.3 to 2 Angstrom per cycle.

In some embodiments, the layer has a growth per cycle in the range of 0.3 to 2.0 Å/cycle. In some embodiments, the layer has a growth per cycle in the range of 0.5 to 1.8 Å/cycle. In some embodiments, the layer has a growth per cycle in the range of 0.7 to 1.6 Å/cycle. In some embodiments, the layer has a growth per cycle in the range of 0.9 to 1.4 Å/cycle.

In some embodiments, the layer contains less than 20%, or less than 10%, or less than 5% phosphorous impurity. In some embodiments, the layer contains 0-5% phosphorus impurity. In some embodiments, the layer contains less than 4%, or less than 3%, or less than 2%, or less than 1% or less than 0.5% phosphorus impurity. In some embodiments, the layer contains between 100 ppm and 4% phosphorus impurity. In some embodiments, the layer contains less than 1% phosphorus impurity. In some embodiments, the layer contains less than 1000 ppm phosphorus impurity. In some embodiments, the layer is free of phosphorous impurity. All percentages presented in this paragraph are atomic percentages calculated from the total number of atoms in the deposited layer.

In some embodiments, the deposited layer has a carbon content of up to 50%. In some embodiments, the carbon content is 0-35%, or 0-20%, or 0-15%, or 0-10%. In some embodiments, the carbon content is <5%, or <3%, or <2%, or <1%, or 0.5%, or <0.1%. In some embodiments the carbon content is >1 ppm, or >0.001%, or >0.01%, or 0.1% or >0.5%. All percentages presented in this paragraph are atomic percentages calculated from the total number of atoms in the deposited layer.

In some embodiments, the deposited layer has a hydrogen content of 0-35%, or 0-20%, or 0-15% or 0-10%. In some embodiments, the hydrogen content is less than 5%. All percentages presented in this paragraph are atomic percentages calculated from the total number of atoms in the deposited layer.

In some embodiments, the deposited layer has a nitrogen content of 0-60%, or 0-50%, or 0-35%, or 0-20%, or 0-15%, or 0-10%. All percentages presented in this paragraph are atomic percentages calculated from the total number of atoms in the deposited layer.

In some embodiments, the deposited layer has a silicon content of more than 95%, or more than 90%, or more than 80%, or more than 70%, or more than 60%, or more than 50%, or more than 40% or more than 30% or more than 20%. All percentages presented in this paragraph are atomic percentages calculated from the total number of atoms in the deposited layer.

According to some embodiments silicon-containing layers with various wet etch rates (WER) may be deposited. When using a blanket WER in 0.5% dHF (nm/min), silicon nitride films may have WER values of less than about 5, preferably less than about 4, more preferably less than about 2, and most preferably less than about 1. In some embodiments it could less than about 0.3.

In some embodiments, the layer has a wet etch rate of less than 2.5 nm/min in 1.5% dilute hydrofluoric acid. In some embodiments, the layer has a wet etch rate of less than 1.5 nm/min in 1.5% dilute hydrofluoric acid.

In some embodiments, the silicon-containing layers with compressive stress may be deposited. In some embodiments, the silicon-containing layers with tensile stress may be deposited. In some embodiments, the stress is between −2000 and +2000 MPa. In some embodiments the stress is between −100 and +100 MPa.

In some embodiments, the silicon-containing layers with elastic modulus may be deposited. In some embodiments, the elastic modulus is more than 20 GPa, or more than 50 GPa, or more than 100 GPa, or more than 200 GPa, or more than 300 GPa.

In some embodiments, the layer has a step coverage of more than about 80%. In some embodiments, the layer has a step coverage of more than about 90%.

In some embodiments, the deposited silicon-containing layer has a thickness non-uniformity and compositional non-uniformity over three dimensional structures. In other words, the layer and the composition of the layer have a value of not being the same in all parts or areas of a three dimensional structure. In some embodiments, the thickness non-uniformity and compositional non-uniformity is less than 30%, or less than 15%, or less than 10%, or less than 5%, or less than 3%, or less than 2%, or less than 1%, or less than 0.5%, or less than 0.1%.

Further described herein is a layer comprising silicon obtained by depositing a precursor having a structure according to the general formula:

$$PX_n(SiR_3)_{3-n}$$

wherein P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently.

Further described herein is a composition configured for depositing a layer, the composition comprising a chemical precursor having a structure according to the general formula:

$$PX_n(SiR_3)_{3-n}$$

wherein P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently. In some embodiments, the halogen can be selected from chlorine, bromine, fluorine and iodine. In some embodiments, the chemical precursor is $P(SiH_2Cl)_3$ or $P(SiH_2I)_3$. In some embodiments the composition has a certain purity level measured by the weight of the composition. In some embodiments, the silicon precursor composition comprises at least about 50 wt % of the silicon precursor, or at least about 80 wt % of the silicon precursor, or at least about 90 wt % of the silicon precursor, or at least about 95 wt % of the silicon precursor, or at least about 97 wt % of the silicon precursor, or at least about 98 wt % of the silicon precursor, or at least about 99 wt % of the silicon precursor, or at least about 99.5 wt % of the silicon precursor, or at least about 99.9 wt % of the silicon precursor, or at least about 99.99 wt % of the silicon precursor.

In some embodiments the compositions described herein are silicon precursor compositions to be used in vapor deposition process, such as thermal ALD, cyclic or continuous CVD, PEALD, REALD or PECVD. The silicon precursor compositions disclosed herein are suitable for forming silicon-containing thin films using a vapor deposition method. Hence, in these embodiments, the silicon precursor composition should have a suitable purity for thin film applications. The silicon precursor should also have a sufficient vapor pressure and thermal stability over the temperature range of the deposition process. By selectively choosing the substituent groups on the silicon precursor, the vapor pressure and other features may be tuned. In some embodiments, the silicon precursor composition comprises at least about 50 wt % of the silicon precursor, or at least about 80 wt % of the silicon precursor, or at least about 90 wt % of the silicon precursor, or at least about 95 wt % of the silicon precursor, or at least about 97 wt % of the silicon precursor, or at least about 98 wt % of the silicon precursor, or at least about 99 wt % of the silicon precursor, or at least about 99.5 wt % of the silicon precursor, or at least about 99.9 wt % of the silicon precursor, or at least about 99.99 wt % of the silicon precursor.

In some embodiments the compositions described herein are used in vapor deposition process, such as thermal ALD, cyclic or continuous CVD, PEALD, REALD (radical enhanced ALD), or PECVD, or flowable processes, such as flowable CVD, or mixtures thereof to deposit film comprising silicon, such as silicon nitride, silicon carbide, silicon oxide, or mixtures thereof. In some embodiments the films are not epitaxial films. In some embodiments the films are not single-crystal films. In some embodiments the films comprises amorphous structure. In some embodiments the films comprises polycrystalline structure. In some embodiments the films comprises amorphous or polycrystalline silicon. In some embodiments films deposited using composition comprises oxygen impurities originating from the composition. In some embodiments the composition is used to deposit silicon based dielectric or insulating films.

In some embodiments the compositions described herein are silicon precursor compositions which are packaged in a vessel, such as quartz or metal such as aluminum or steels vessels, which are suitable to be used in reactors for vapor deposition processes, such as thermal ALD, cyclic or continuous CVD, PEALD, REALD or PECVD. The silicon precursor compositions in a vessel disclosed herein are suitable for forming silicon containing thin films using a vapor deposition method. Hence, in these embodiments, the silicon precursor composition in a vessel should have a suitable purity for thin film applications. The silicon precursor should also have a sufficient vapor pressure and thermal stability over the temperature range of the deposition process. By selectively choosing the substituent groups on the silicon precursor, the vapor pressure and other features may be tuned. In some embodiments, the silicon precursor composition in a vessel comprises at least about 50 wt % of the silicon precursor, or at least about 80 wt % of the silicon precursor, or at least about 90 wt % of the silicon precursor, or at least about 95 wt % of the silicon precursor, or at least about 97 wt % of the silicon precursor, or at least about 98 wt % of the silicon precursor, or at least about 99 wt % of the silicon precursor, or at least about 99.5 wt % of the silicon precursor, or at least about 99.9 wt % of the silicon precursor, at least about 99.99 wt % of the silicon precursor, or at least about 99.999 wt % of the silicon precursor.

In some embodiments the compositions described herein are silicon precursor compositions to be used in vapor deposition process, such as thermal ALD, cyclic or continuous CVD, PEALD, REALD or PECVD.

Impurities in the composition, silicon precursor composition, or silicon precursor composition in a vessel suitable for vapor deposition processes can comprise for example oxygen, nitrogen, sulfur, metal or carbon impurities. Impurities might comprise, for example, atoms or molecules of solvents used in the synthesis method or other atoms present in the synthesis method. Following impurity ranges comprise impurities in the composition, silicon precursor composition, or silicon precursor composition in a vessel suitable for vapor deposition processes described weight percentage.

In some embodiments solvent impurities comprises one or more of molecules: pentane, hexane, cyclohexane, benzene, toluene, xylene, diethyl ether, methyl tert-butyl ether, tetrahydrofuran, 1,4-dioxane, acetonitrile, chloroform, dichloromethane, carbon tetrachloride, triethyl amine, pyridine, ethyl acetate, 1,2-dimethoxyethane, dimethyl sulfoxide, 1,2-dichloroethane, chlorobenzene, acetone, 2-butanone, or species of those. In some embodiments solvent impurities comprises molecules comprising oxygen, nitrogen, or sulfur, or mixtures thereof. In some embodiments the solvent impurities are impurities from solvent used in the synthesis methods used to from the composition.

In some embodiments, the species impurities comprise for example $P(SiMe_3)_3$, $SiH_3Cl$, $SiH_2Cl_2$, $SiHCl_3$, $SiCl_4$, $SiHMe_3$, $SiClMe_3$, $P(SiH_3)(SiMe_3)_2$, $P(SiH_3)_2(SiMe_3)$, $PCl(SiH_3)_2$, $PCl_2(SiH_3)$, $PCl(SiMe_3)_2$, $PCl_2(SiMe_3)$, $PCl_3$, $PH(SiH_3)_2$, $PH_2(SiH_3)$, $PH(SiMe_3)_2$, or $PH_2(SiMe_3)$. In some embodiments the impurities comprise $P(OSiMe_3)_x(SiMe_3)_y$, $P(OSiMe_3)_x(SiH_3)_y$, $P(OSiH_3)_x(SiH_3)_y$, or $P(OSiH_3)_x(SiMe_3)_y$, where x=1 to 3 and where x+y=3. In some embodiments the impurities comprise $PH_x(OSiMe_3)_y(SiMe_3)_z$, $PH_x(OSiMe_3)_y(SiH_3)_z$, $PH_x(OSiH_3)_y(SiH_3)_z$, $PH_x(OSiH_3)_y(SiMe_3)_z$, where x=1 or 2, and where y=1 or 2, where z=0 or 1, and where x+y+z=3. In some embodiments the impurities comprise $P(Hal)_x(OSiMe_3)_y(SiMe_3)_z$, $P(Hal)_x(OSiMe_3)_y(SiH_3)_z$, $P(Hal)_x(OSiH_3)_y(SiH_3)_z$, $P(Hal)_x(OSiH_3)_y(SiMe_3)_z$, where x=1 or 2, and where y=1 or 2, where z=0 or 1, and where x+y+z=3, and where "Hal" is a halogen substituent selected from F, Cl, Br, and I.

In some embodiments, the species impurities comprise from about ppm to about 50 wt-%, from about 0.001 wt-% to about 20 wt-%, or from about 0.01 wt-% to about 10 wt-% of species impurities described above. Solvent impurities comprise from about ppm to about 50 wt-%, from about 0.001 wt-% to about 20 wt-%, or from about 0.01 wt-% to about 10 wt-% of solvent impurities described above.

Impurities of oxygen, nitrogen or sulfur, individually or combined, can be from ppb or ppm level upwards, can be more than about 100 ppb, more than about 1 ppm, more than about 0.001 wt-%, more than about 0.01 wt-%, more than about 0.1 wt-%, more than about 0.5 wt-%, more than about 1 wt-%, or more than about 5 wt-%. In some embodiments, from about 0.001 wt-% to about 10 wt-%, from about 0.01 wt-% to about 5 wt-%, or from about 0.1 wt-% to about 5 wt-%. In some embodiments, impurities of oxygen, nitrogen or sulfur, individually or combined are less than about 0.01 wt-%, less than about 0.1 wt-%, less than about 0.5 wt-%, less than about 1 wt-%, or less than about 5 wt-%. In some embodiments, from about 0.001 wt-% to about 10 wt-%, from about 0.01 wt-% to about 5 wt-%, or from about 0.1 wt-% to about 5 wt-%.

Impurities comprising metals can be from ppb or ppm level upwards. Alternatively metal impurities can be less than ppb or ppm level. Metal impurities can be more than about 100 ppb, more than about 1 ppm, more than about 0.001 wt-%, more than about 0.01 wt-%, more than about 0.1 wt-%, more than about 0.5 wt-%, or more than about 1 wt-%. Metal impurities can be less than about 0.001 wt-%, less than about 0.01 wt-%, less than about 0.1 wt-%, less than about 0.5 wt-%, or less than about 1 wt-%.

Impurities comprising moisture can be from ppb or ppm level upwards. Alternatively metal impurities can be less than ppb or ppm level. Metal impurities can be more than about 100 ppb, more than about 1 ppm, more than about 0.001 wt-%, more than about 0.01 wt-%, more than about 0.1 wt-%, more than about 0.5 wt-%, or more than about 1 wt-%. Metal impurities can be less than about 0.001 wt-%, less than about 0.01 wt-%, less than about 0.1 wt-%, less than about 0.5 wt-%, or less than about 1 wt-%.

Carbon impurities can be from ppb or ppm level upwards, such as more than about 100 ppb, more than about 1 ppm, more than about 0.001 wt-%, more than about 0.01 wt-%, more than about 0.1 wt-%, more than about 0.5 wt-%, more than about 1 wt-%, or more than about 5 wt-%. In some embodiments, carbon impurities can be from about 0.001 wt-% to about 20 wt-%, from about 0.01 wt-% to about 20 wt-%, or from about 0.1 wt-% to about 10 wt-%. In some embodiments, carbon impurities comprise less than about 0.01 wt-%, less than about 0.1 wt-%, less than about 0.5 wt-%, less than about 1 wt-%, less than about 5 wt-%, less than about 10 wt-%, or less than about 20 wt-%. In some embodiments, carbon impurities can be from about ppm to about 20 wt-%, from about 0.001 wt-% to about 10 wt-%, or from about 0.01 wt-% to about 5 wt-%.

Impurities of oxygen, nitrogen or sulfur, individually or combined, can be from ppb or ppm level upwards, can be more than about 100 ppb, more than about 1 ppm, more than about 0.001 wt-%, more than about 0.01 wt-%, more than about 0.1 wt-more than about 0.5 wt-%, more than about 1 wt-%, or more than about 5 wt-%. In some embodiments, from about 0.001 wt-% to about 10 wt-%, from about 0.01 wt-% to about 5 wt-%, or from about 0.1 wt-% to about 5 wt-%.

The disclosed chemical precursor having a structure according to the general formula $PX_n(SiR_3)_{3-n}$ wherein P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently, may be formed according to a synthesis method described herein. Disclosed are silicon containing composition, such as film forming compositions comprising inorganic silyls and polysilyls having phosphorus, methods of synthesizing them and methods of using them to deposit the films comprising silicon, for example using gas phase deposition methods, such as thermal ALD, cyclic or continuous CVD, PEALD, REALD (radical enhanced ALD), or PECVD, or flowable processes, such as flowable CVD, or mixtures thereof to.

Figure 8:
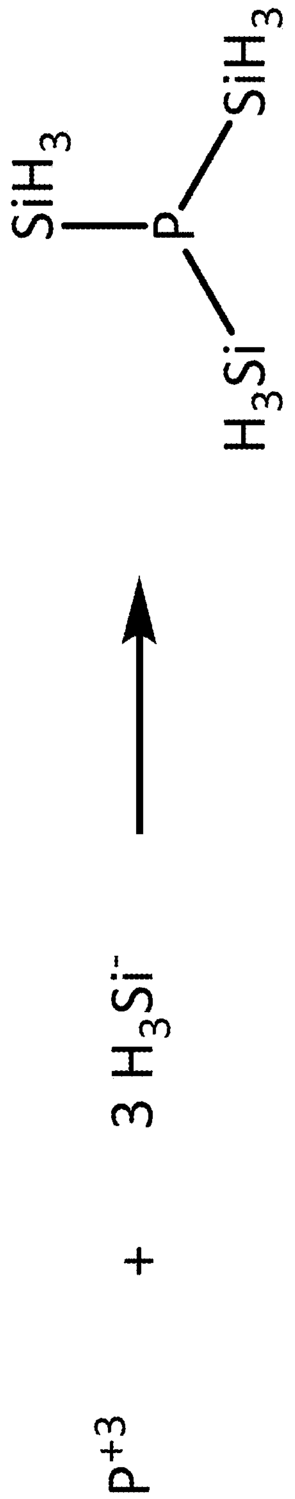
FIG. 8 shows a general synthesis method for the chemical precursor.

FIG. 8 is generally illustrating the methods or process, such as synthesis methods, for forming composition described herein. In some embodiments the process for making composition, such as the Si-precursor, comprises reacting a silicon nucleophile and phosphorus electrophile and thereby forming a composition described herein. This method eliminates the need for raw materials that are pyrophoric and difficult to make and therefore, have advantages being simple method, scalable to large quantities and safer method. And raw materials are also readily available. Quantities made can be more than 10 g, more than 100 g, more than 1 kg, or more than 10 kg.

In some embodiments the synthesis methods for forming the compositions described herein comprises forming a first intermediate product by combining alkali metal, such as metallic Li, and a Si-compound and subsequently adding phosphorous compound to the reaction product formed by reaction between alkali metal and Si-compound to form the first intermediate product. In some embodiments the first intermediate product is made in one pot or batch process. In some embodiments the silicon compound is an aromatic halosilane, such as chloro(phenyl)silane. In some embodiments the phosphorous compound is phosphorous halide, such as $PCl_3$, $PBr_3$ or $PI_3$. In some embodiments the first product, i.e. the intermediate molecule compound, is aromatic compound comprising phenylsilyl groups attached to phosphorous, such as 1,3-diphenyl-2-(phenylsilyl)disilaphosphane.

In some embodiments the synthesis methods for forming the compositions described herein comprises forming second chemical precursor product by reacting the first intermediate product with acid, such as triflic acid (trifluoromethanesulfonic acid; TfOH) and subsequently adding alkali metal hydride, compound to the reaction product formed by reaction between first intermediate product and acid to form the second chemical precursor product. In some embodiments the alkaline metal hydride has the general formula of $MH_x$, where M is alkaline or alkaline earth metal and x is 1 or 2. In some embodiments, the alkali metal hydride is potassium hydride (KH). In some embodiments, the alkali metal hydride is selected from the group consisting of $Et_3BHLi$, $LiAlH_4$, $LiBH_4$, $NaBH_4$ and $Cp_2Zr(H)Cl$). In some embodiments the second chemical precursor product is made in one pot or batch process. In some embodiments the second chemical precursor product comprises the compositions described herein, such as the silicon precursors described herein.

In some embodiments, the synthesis methods for forming the compositions described herein comprises forming second chemical precursor product by reacting the first intermediate product with acid, such as triflic acid (trifluoromethanesulfonic acid; TfOH) and subsequently adding alkali metal halide, compound to the reaction product formed by reaction between first intermediate product and acid to form the second chemical precursor product. In some embodiments the alkaline metal halide has the general formula of MX, where M is alkaline or alkaline earth metal, such as Li, Na, K, Rb, Cs, Mg, Ca, or $NR_4$, wherein R is hydrogen, halogen, hydrocarbyl group, alkoxy group, silyl group, alkyl group and aryl group, and X is halogen, such as Cl, Br or I. In some embodiments the second chemical precursor product is made in one pot or batch process. In some embodiments the second chemical precursor product comprises the compositions described herein, such as the silicon precursors described herein.

In some embodiments the first intermediate product and second chemical precursor product are performed in a same reaction chamber, for example, which is used to synthesize the compositions described herein. In some embodiments the first intermediate product and second chemical precursor product are performed in a same reaction chamber but in two different steps or batches, for example steps for forming first intermediate product and second chemical precursor product. In some embodiments the during forming the first intermediate product, during forming the second chemical precursor product or during both steps, the reaction mixture is stirred, for example continuously. In some embodiments the reaction mixture is temperature controlled, for example cooled or heated, and the reaction mixture is kept from about −80° C. to about 90° C.

In some embodiments, the formed chemical precursor has the general formula of

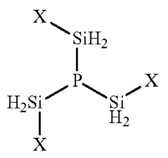

wherein X is selected from the group consisting of Cl, Br, I and H, alkyl group.

Figure 9:
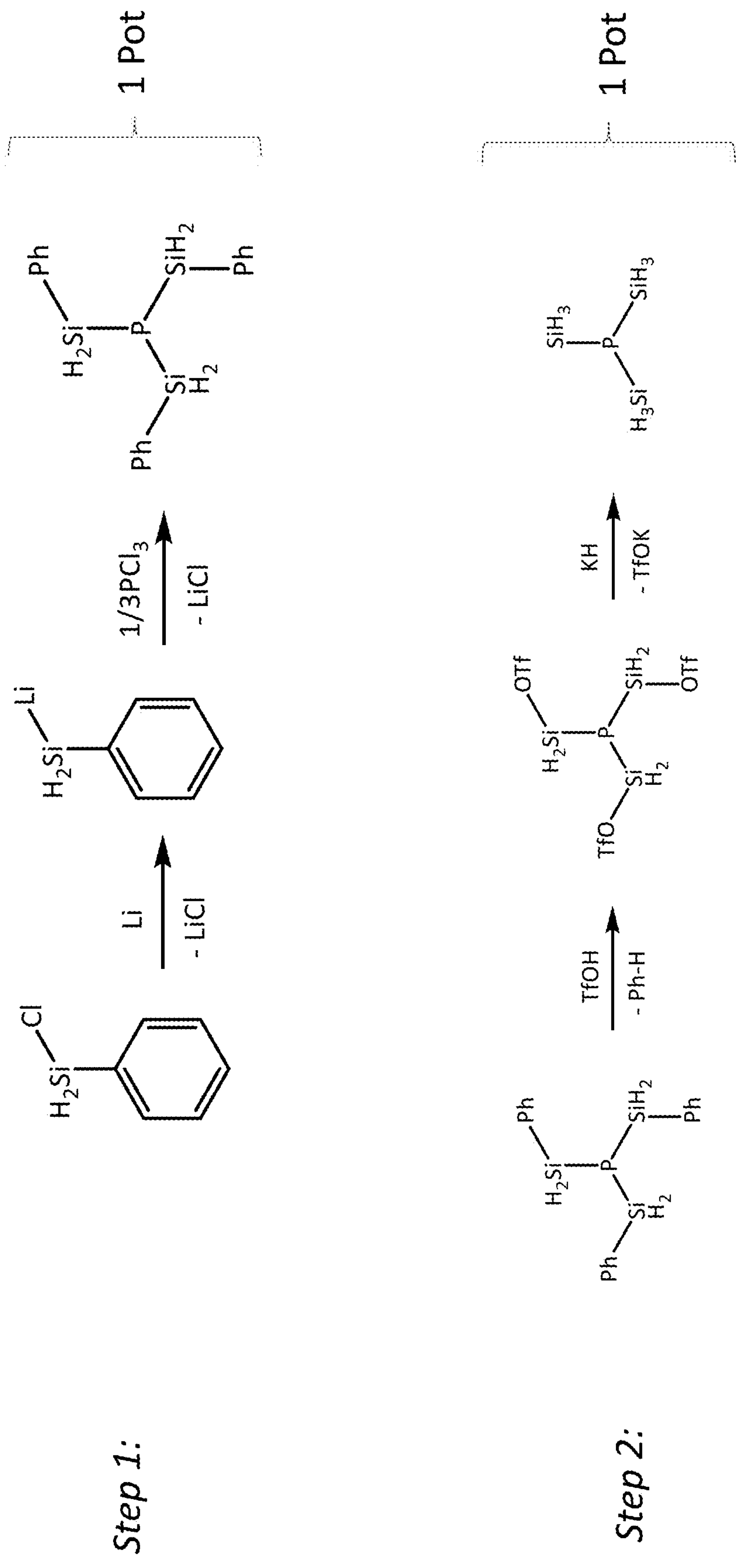
FIG. 9 shows a synthesis method for the chemical precursor.

In some embodiments the compositions described herein comprises chemical precursors having formula $PX_n(SiR_3)_{3-n}$, such as trisilylphosphine. The synthesis methods, including the steps of forming the first intermediate product and the second chemical precursor product is illustrated in FIG. 9.

In some embodiments the synthesis methods for the first intermediate product or for second chemical precursor product or for both is comprises using a solvent, for example in the reaction chamber wherein the synthesis methods are carried out. In some embodiments the solvent comprises pentane, hexane, cyclohexane, benzene, toluene, xylene, diethyl ether, methyl tert-butyl ether, tetrahydrofuran, 1,4-dioxane, acetonitrile, chloroform, dichloromethane, carbon tetrachloride, triethyl amine, pyridine, ethyl acetate, 1,2-dimethoxyethane, dimethyl sulfoxide, 1,2-dichloroethane, chlorobenzene, acetone, 2-butanone, or species of those. In some embodiments solvent impurities comprises molecules comprising oxygen, nitrogen, or sulfur, or mixtures thereof. In some embodiments the solvent impurities are impurities from solvent used in the synthesis methods used to from the composition.

Further described herein is a vapor delivery vessel comprising a film forming composition for depositing an amorphous silicon and non-metal-containing layer by PEALD, the composition comprising a chemical precursor having a structure according to the general formula:

PXn(SiR3)3-n wherein P is phosphorus;

Si is silicon bonded to phosphorus by a Si—P bond;

n is an integer having the value of 0, 1 or 2; and

X is a substituent bonded to phosphorus selected from the group consisting of hydrocarbyl group, halogen, hydrogen, amino group, alkoxy group, alkyl group and aryl group; and R is a substituent that is attached to Si selected from the group consisting of hydrogen, halogen, hydrocarbyl group, alkoxy group, silyl group, alkyl group and aryl group;

wherein each X and R is selected independently;

wherein the composition has a purity of less than 99.9 (w/w %); and wherein the composition comprises more than 1 ppm (w/w %) of at least one impurity selected from the list consisting of oxygen-containing, carbon-containing, nitrogen-containing, sulfur-containing and metal-containing impurity.

In some embodiments, the vessel comprises an outer wall that encloses a cavity for storing the film forming composition. In some embodiments, the vessel comprises a gas outlet for allowing a vapor of the film forming composition to exit the cavity. In some embodiments, the vessel further comprises a gas inlet and a conduit extending into the cavity to a fixed point. In some embodiments, the conduit extends into the cavity and into the film forming composition for passing a carrier gas through the film forming composition. In some embodiments, the conduit extends into the cavity to a point that is above the film forming composition for passing a carrier gas over the surface of the film forming composition. In some embodiments, the vessel further comprises a probe member. In some embodiments, the probe member comprises one or more temperature sensors and/or one or more level sensors and one or more pressure sensors. In some embodiments, the outer wall and the cavity are formed from stainless steel. In some embodiments, the vessel is suitable to be attached to a vapor deposition reactor.

Further described herein is a vessel comprising a chemical precursor having a structure according to the general formula:

$$PX_n(SiR_3)_{3-n}$$

wherein P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently.

In one aspect the disclosure relates to composition comprising trisilylphosphine and impurities wherein the composition has a purity of less than 99.99 (w/w %) of trisilylphosphine and wherein the composition comprises more than 1 ppb (w/w %) of at least one impurity selected from the list consisting of oxygen-containing, carbon-containing, nitrogen-containing, sulfur-containing, metal-containing impurity and halogen-containing.

In some embodiments, the composition further comprises from about 0.01 wt-% to about 10 wt-% solvent as impurity, and wherein the solvent is selected from at least one of the group consisting of pentane, hexane, cyclohexane, benzene, toluene, xylene, diethyl ether, methyl tert-butyl ether, tetrahydrofuran, 1,4-dioxane, acetonitrile, chloroform, dichloromethane, carbon tetrachloride, triethyl amine, pyridine, ethyl acetate, 1,2-dimethoxyethane, dimethyl sulfoxide, 1,2-dichloroethane, chlorobenzene, acetone, 2-butanone, and species thereof.

In some embodiments, the composition comprises from about 0.01 wt-% to about 10 wt-% species impurities, and wherein the species impurities are selected from the group consisting of $P(SiMe_3)_3$, $SiH_3Cl$, $SiH_2Cl_2$, $SiHCl_3$, $SiCl_4$, $SiHMe_3$, $SiClMe_3$, $P(SiH_3)(SiMe_3)_2$, $P(SiH_3)_2(SiMe_3)$, $PCl(SiH_3)_2$, $PCl_2(SiH_3)$, $PCl(SiMe_3)_2$, $PCl_2(SiMe_3)$, $PCl_3$, $PH(SiH_3)_2$, $PH_2(SiH_3)$, $PH(SiMe_3)_2$, and $PH_2(SiMe_3)$.

In some embodiments, the composition does not comprise any impurities selected from the group consisting of $P(SiMe_3)_3$, $SiH_3Cl$, $SiH_2Cl_2$, $SiHCl_3$, $SiCl_4$, $SiHMe_3$, $SiClMe_3$, $P(SiH_3)(SiMe_3)_2$, $P(SiH_3)_2(SiMe_3)$, $PCl(SiH_3)_2$, $PCl_2(SiH_3)$, $PCl(SiMe_3)_2$, $PCl_2(SiMe_3)$, $PCl_3$, $PH(SiH_3)_2$, $PH_2(SiH_3)$, $PH(SiMe_3)_2$, and $PH_2(SiMe_3)$.

In some embodiments, the composition does not comprise group IV halide. In some embodiments, the group IV element in the group IV halide is selected from the list tin, germanium and silicon. Halogens are not preferred in the composition for their known environmental aspects.

In some embodiments, the composition does not comprise phosphorus-hydrogen bond. Compositions with the phosphorous-hydrogen bond are hard to handle, they are toxic and harmful. Also, a composition with phosphorous-hydrogen bond increases the phosphorous-content in the film which it not preferred in some embodiments.

In some embodiments, the composition does not comprise silyl chloride. Compositions comprising silyl chloride, such as TMS chloride, are known to passivate the surface and therefore not wanted in the composition in some embodiments.

In some embodiments, the composition comprises from about 0.01 wt-% to about 10 wt-% species impurities, and wherein the species impurities are selected from the group consisting of $P(OSiMe_3)_x(SiMe_3)_y$, $P(OSiMe_3)_x(SiH_3)_y$, $P(OSiH_3)_x(SiH_3)_y$, and $P(OSiH_3)_x(SiMe_3)_y$, where x=1 to 3 and where x+y=3.

In some embodiments, the composition comprises from about 0.01 wt-% to about 10 wt-% species impurities, and wherein the species impurities are selected from the group consisting of $PH_x(OSiMe_3)_y(SiMe_3)_z$, $PH_x(OSiMe_3)_y(SiH_3)_z$, $PH_x(OSiH_3)_y(SiH_3)_z$, and $PH_x(OSiH_3)_y(SiMe_3)_z$, where x=1 or 2, and where y=1 or 2, where z=0 or 1, and where x+y+z=3.

In some embodiments, the composition comprises from about 0.01 wt-% to about 10 wt-% species impurities, and wherein the species impurities are selected from the group consisting of $P(Hal)_x(OSiMe_3)_y(SiMe_3)_z$, $P(Hal)_x(OSiMe_3)_y(SiH_3)_z$, $P(Hal)_x(OSiH_3)_y(SiH_3)_z$, and $P(Hal)_x(OSiH_3)_y(SiMe_3)_z$, where x=1 or 2, and where y=1 or 2, where z=0 or 1, and where x+y+z=3, and where "Hal" is a halogen substituent selected from F, Cl, Br, and I.

In a further aspect, the silicon containing layer is deposited using a thermal atomic layer deposition process. In other words, the process does not contain a plasma pulse. In the process the chemical precursor according to the general formula:

$$PX_n(SiR_3)_{3-n}$$

is provided in vapor phase into the reaction chamber containing a substrate and a second precursor is provided into the reaction chamber in vapor phase. In the general formula P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently.

In some embodiments, the chemical precursor chemisorbs on to the surface of the substrate. The second precursor then reacts with the chemisorbed chemical precursor.

In some embodiments, the second precursor is selected from the list consisting of NH3, $N(HxRy)_3$ where R is methyl, ethyl or iso-propyl, x is 0, 1 or 2 and y is 1, 2 or 3; N2H4; H2O; MX where M is any metal and X is a halide; Si(HyXz) where X is halide, y is 4-z and z is 1, 2, 3 or 4; and CxHyIz where if x=1, y=1, 2, 3 or 4 and z=4-y, or if x=2, y=1, 2, 3, 4, 5 or 6 and z=6-y or if x=3, y=1, 2, 3, 4, 5, 6, 7 or 8 and z=8-y. In some embodiments, the second precursor is selected from the list consisting of CIH3, CI2H2, CI3H and CI4.

In some embodiments, the process is performed at a temperature between 10° and 600° C., such as temperatures between 30° and 450° C.

In some aspects, there is provided a process for depositing a layer containing silicon, wherein the process is a plasma-enhanced chemical vapor deposition (PECVD) process. In other words, the first precursor pulses and the plasma pulses are executed nonsequentially, i.e. so the pulses overlap and there is no purges between the pulses. In some aspects the precursor flow and plasma power are both on continuously for an extended period of time, i.e. the process is not a pulsed process.

In these aspects, the plasma pulses include providing a reactant gas into the reactor chamber and simultaneously having the plasma power on. Depending on the desired layer the reactant may be either oxygen-containing, nitrogen-containing or noble gas-containing reactant. If the reactant is an oxygen-containing reactant, the deposited film is oxidized and the produced film is silicon oxide. If the reactant is a nitrogen-containing reactant, the deposited film is nitridated and the produced film is silicon nitride. If the reactant is noble gas, or a mixture of noble gas and hydrogen, the deposited film may be amorphous silicon or phosphorous doped amorphous silicon. In some embodiments, the reactant may also contain carbon. In these embodiments, the produced film can be either silicon carbide or silicon carbonitride.

In some aspects, there is provided a process for depositing a layer containing silicon, wherein the process is a thermal chemical vapor deposition process. In the process the chemical precursor in vapor phase is provided into a reaction chamber having a substrate. In the process the chemical precursor according to the general formula:

$$PX_n(SiR_3)_{3-n}$$

where P is phosphorus, Si is silicon bonded to phosphorus by a Si—P bond, n is an integer having the value of 0, 1 or 2, X is a substituent bonded to phosphorus selected from the group consisting of hydrocarbyl group, halogen, hydrogen, amino group, alkoxy group, alkyl group and aryl group, and R is a substituent that is attached to Si selected from the group consisting of hydrogen, halogen, hydrocarbyl group, alkoxy group, silyl group, alkyl group and aryl group. Each R and X is selected independently.

The temperature during the deposition process is above 400° C. In some embodiments, the temperature during the deposition process is between 40° and 500° C. In some embodiments, the temperature during the deposition process is between 40° and 600° C. In some embodiments, a reactive gas is provided into the reaction chamber in a second step. The reactive gas may comprise $NH_3$ or $H_2H_4$ when the desired deposited layer comprises silicon and nitrogen. The reactive gas may comprise $O_2$, $O_3$ or $H_2O$ when the desired deposited layer comprises silicon and oxygen.

In some embodiments, the layer deposited by any one of the above mentioned processes can be used for gap fill applications. This means that a substrate having a gap is provided into the reaction chamber. The chemical precursor is deposited into the substrate. The plasma pulse makes the chemical precursor flowable, in other words is becomes polymer-like, and it fills the gap in the substrate. The flowable aspect of the precursor enables a seam-free gap fill.

In some embodiments, the layer deposited by any one of the above mentioned processes may be used as a spacer layer in a semiconductor structure. In some embodiments, the layer deposited by any one of the above mentioned processes may be used as a protective liner or an etch stop layer or a spacer in multiple patterning.

Further described herein is a semiconductor processing apparatus. The apparatus comprises a reaction chamber. The reaction chamber comprises a substrate support for supporting a substrate.

The system further comprises a heater. The heater is constructed and arranged to heat the substrate in the reaction camber.

The system further comprises a plasma module. The plasma module comprises a radio frequency power source that is constructed and arranged to generate a plasma. In some embodiments, the plasma module is arranged in a remote plasma configuration in which the plasma can be generated outside of the reaction chamber, and in which plasma-generated active species can be directed to the substrate. In some embodiments, the plasma module is arranged in an indirect plasma configuration in which the plasma can be generated in a plasma generation space comprised in the reaction chamber, the plasma generation space being separated from a substrate-containing space comprised in the reaction chamber by a conductive mesh plate or perforated plate, the substrate-containing space comprising the substrate. In some embodiments, the plasma module is arranged in a direct plasma configuration in which the plasma is generated in the reaction chamber and in which the plasma is not physically separated from the substrate.

The system further comprises a suitable amount of sources. For example, the system can comprise a plasma gas source in fluid connection with the plasma module, and a first precursor source in fluid connection with the reaction chamber via one or more precursor valves. Optionally, instead of comprising a first precursor source, the system can comprise silicon precursor source in fluid connection with the reaction chamber via one or more precursor valves and a phosphorus precursor source in fluid connection with the reaction chamber via one or more precursor valves.

The system further comprises a controller. The controller is configured for causing the semiconductor processing apparatus to perform a method as described herein.

Optionally, the system is configured for providing the first precursor, or the silicon precursor and the phosphorus precursor, to the reaction chamber by means of a carrier gas. Suitable carrier gasses include noble gasses. In other words, in some embodiments, the semiconductor processing system comprises a gas injection system comprising a precursor delivery system that employs a carrier gas for carrying the precursor to one or more reaction chambers.

FIG. 1 shows a schematic representation of an embodiment of a system (100) as described herein. The system (100) comprises a reaction chamber (110) in which a plasma (120) is generated. In particular, the plasma (120) is generated between a showerhead injector (130) and a substrate support (140). This is a direct plasma configuration employing a capacitively coupled plasma.

In the configuration shown, the system (100) comprises two alternating current (AC) power sources: a high frequency power source (121) and a low frequency power source (122). In the configuration shown, the high frequency power source (121) supplies radio frequency (RF) power to the showerhead injector, and the low frequency power source (122) supplies an alternating current signal to the substrate support (140). The radio frequency power can be provided, for example, at a frequency of 13.56 MHz or higher, e.g. at a frequency of at least 100 kHz to at most 50 MHz, or at a frequency of at least 50 MHz to at most 100 MHz, or at a frequency of at least 100 MHz to at most 200 MHz, or at a frequency of at least 200 MHz to at most 500 MHz, or at a frequency of at least 500 MHz to at most 1000 MHz, or at a frequency of at least 1000 MHz to at most 2000 MHz. The low frequency alternating current signal can be provided, for example, at a frequency of 2 MHz or lower, such as at a frequency of at least 100 kHz to at most 200 kHz, or at a frequency of at least 200 kHz to at most 500 kHz, or at a frequency of at least 500 kHz to at most 1000 kHz, or at a frequency of at least 1000 kHz to at most 2000 kHz.

Process gas comprising precursor, reactant, or both, is provided through a gas line (160) to a conical gas distributor (150). The process gas then passes through holes (131) in the showerhead injector (130) to the reaction chamber (110).

Whereas the high frequency power source (121) is shown as being electrically connected to the showerhead injector, and the low frequency power source (122) is shown as being electrically connected to the substrate support (140), other configurations are possible as well. For example, in some embodiments (not shown), both the high frequency power source and the low frequency power source can be electrically connected to the showerhead injector; or both the high frequency power source and the low frequency power source can be electrically connected to the substrate support; or the high frequency power source can be electrically connected to the substrate support, and the low frequency power source can be electrically connected to the showerhead injector.

Figure 2:
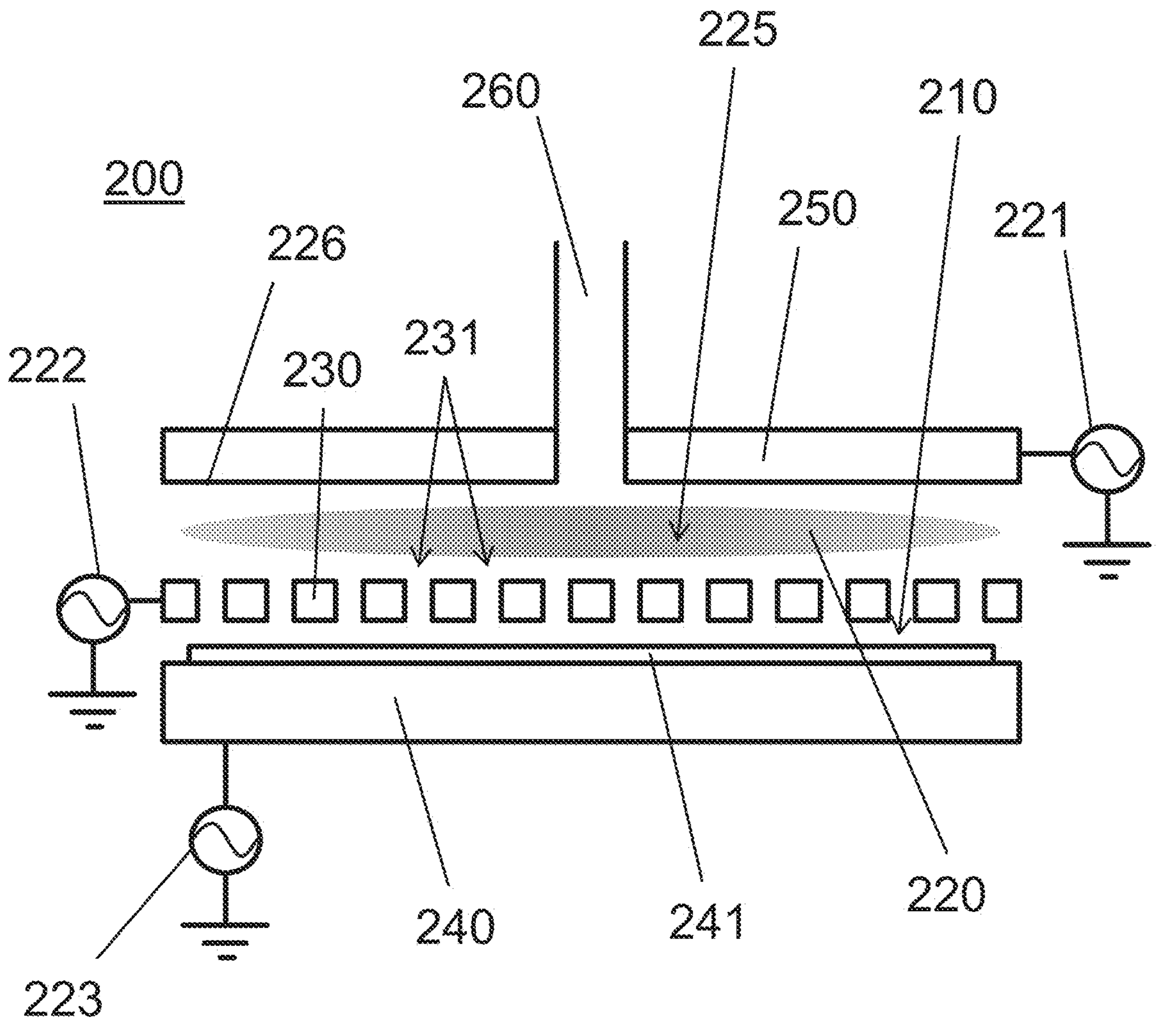
FIG. 2 shows a schematic representation of another embodiment of a system as described herein.

FIG. 2 shows a schematic representation of another embodiment of a system (200) as described herein. The configuration of FIG. 2 can be described as an indirect plasma system. The system (200) comprises a reaction chamber (210) which is separated from a plasma generation space (225) in which a plasma (220) is generated. In particular, the reaction chamber (210) is separated from the plasma generation space (225) by a showerhead injector, and the plasma (220) is generated between the showerhead injector (230) and a plasma generation space ceiling (226).

In the configuration shown, the system (200) comprises three alternating current (AC) power sources: a high frequency power source (221) and two low frequency power sources (222,223): a first low frequency power source (222) and a second low frequency power source (223). In the configuration shown, the high frequency power source (221) supplies radio frequency (RF) power to the plasma generation space ceiling, the first low frequency power source (222) supplies an alternating current signal to the showerhead injector (230), and the second low frequency power source (223) supplies an alternating current signal to the substrate support (240). A substrate (241) is provided on the substrate support (240). The radio frequency power can be provided, for example, at a frequency of 13.56 MHz or higher. The low frequency alternating current signal of the first and second low frequency power sources (222,223) can be provided, for example, at a frequency of 2 MHz or lower.

Process gas comprising precursor, reactant, or both, is provided through a gas line (260) that passes through the plasma generation space ceiling (226), to the plasma generation space (225). Active species such as ions and radicals generated by the plasma (225) from the process gas pass through holes (231) in the showerhead injector (230) to the reaction chamber (210).

Figure 3:
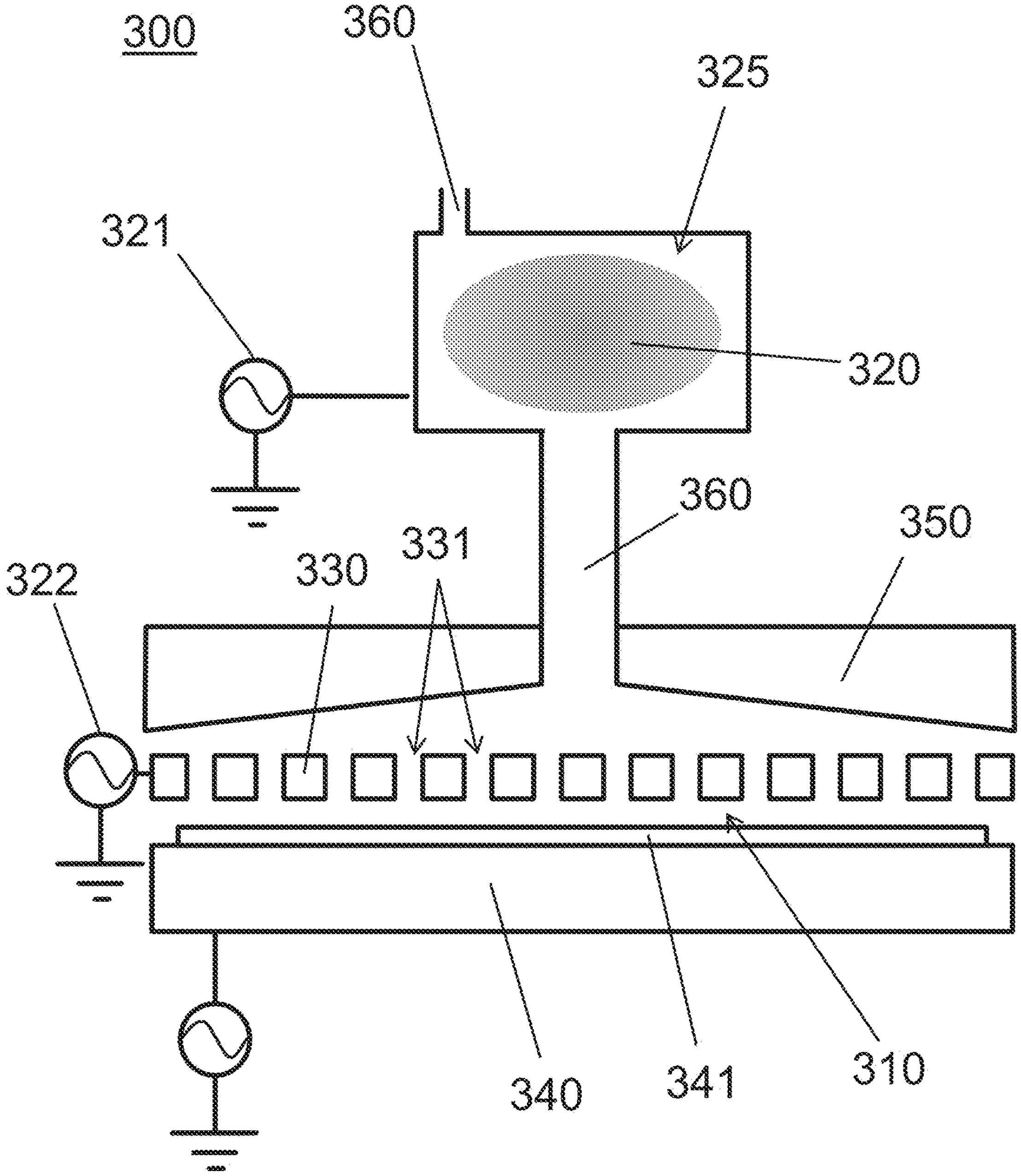
FIG. 3 shows a schematic representation of another embodiment of a system as described herein.

FIG. 3 shows a schematic representation of another embodiment of a system (300) as described herein. The configuration of FIG. 3 can be described as a remote plasma system. The system (300) comprises a reaction chamber (310) which is operationally connected to a remote plasma source (325) in which a plasma (320) is generated. Any sort of plasma source can be used as a remote plasma source (325), for example an inductively coupled plasma, a capacitively coupled plasma, or a microwave plasma.

In particular, active species are provided from the plasma source (325) to the reaction chamber (310) via an active species duct (360), to a conical distributor (350), through holes (331) in a shower plate injector (330), to the reaction chamber (310). Thus, active species can be provided to the reaction chamber in a uniform way.

In the configuration shown, the system (300) comprises three alternating current (AC) power sources: a high frequency power source (321) and two low frequency power sources (822,823): a first low frequency power source (322) and a second low frequency power source (323). In the configuration shown, the high frequency power source (321) supplies radio frequency (RF) power to the plasma generation space ceiling, the first low frequency power source (322) supplies an alternating current signal to the showerhead injector (330), and the second low frequency power source (323) supplies an alternating current signal to the substrate support (340). A substrate (341) is provided on the substrate support (340). The radio frequency power can be provided, for example, at a frequency of 13.56 MHz or higher. The low frequency alternating current signal of the first and second low frequency power sources (322,323) can be provided, for example, at a frequency of 2 MHz or lower.

In some embodiments (not shown), an additional high frequency power source can be electrically connected to the substrate support. Thus, a direct plasma can be generated in the reaction chamber.

Process gas comprising precursor, reactant, or both, is provided to the plasma source (325) by means of a gas line (360). Active species such as ions and radicals generated by the plasma (325) from the process gas are guided to the reaction chamber (310).

Figure 4:
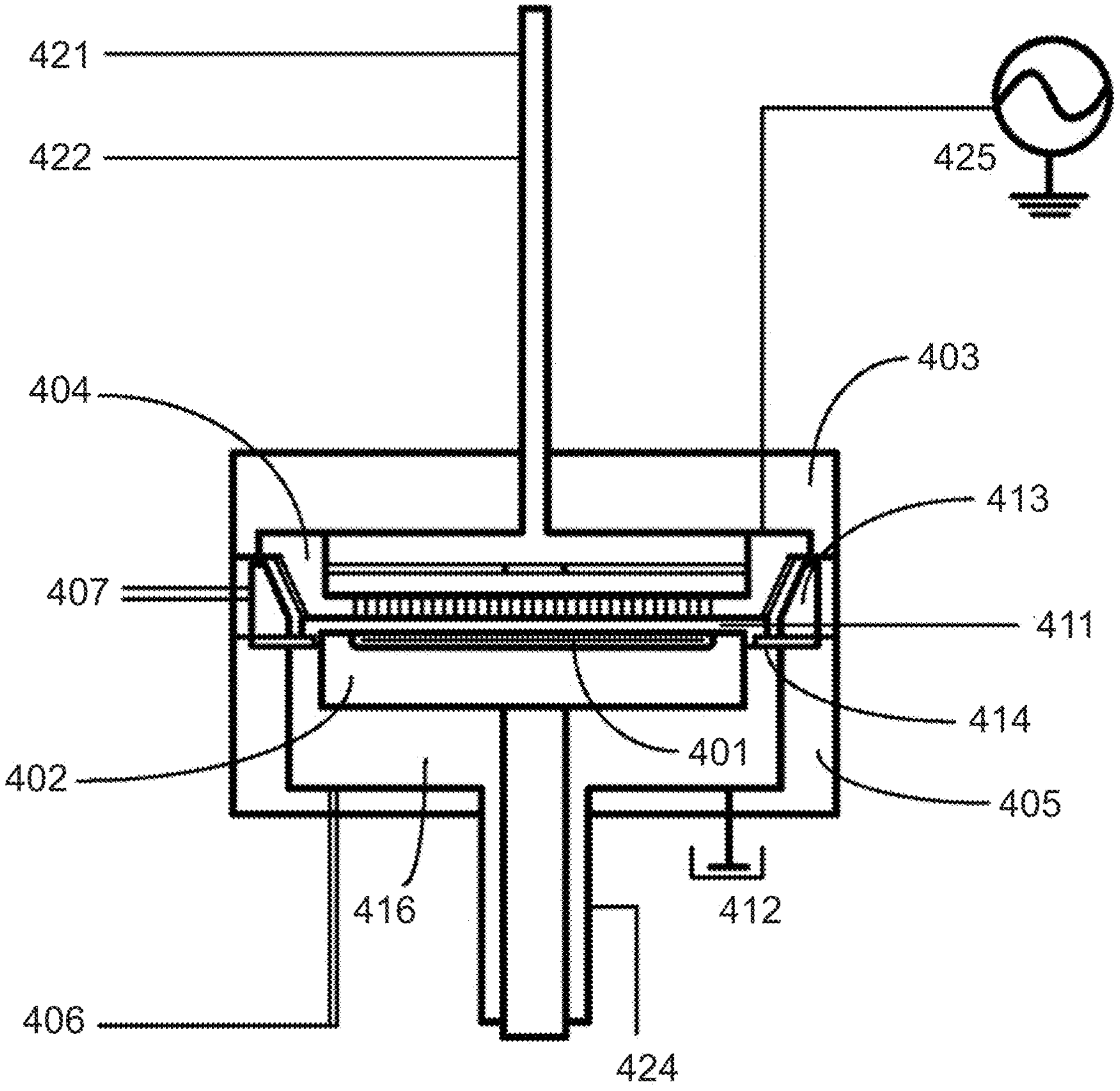
FIG. 4 is a schematic representation of a plasma-enhanced atomic layer deposition (PEALD) apparatus suitable for depositing a structure and/or for performing a method in accordance with at least one embodiment of the present disclosure.

The presently provided methods may be executed in any suitable apparatus, including in an embodiment of a semiconductor processing system as shown in FIG. 4. FIG. 4 is a schematic view of a plasma-enhanced atomic layer deposition (PEALD) apparatus, usable in some embodiments of the present invention. In this figure, by providing a pair of electrically conductive flat-plate electrodes (402,404) in parallel and facing each other in the interior (411) (reaction zone) of a reaction chamber (403), applying RF power (e.g. at 13.56 MHz and/or 27 MHz) from a power source (425) to one side, and electrically grounding the other side (412), a plasma can be generated between the electrodes. Of course, there is no need for the semiconductor processing apparatus to generate a plasma during the steps when a precursor is provided to the reaction chamber, or during purges between subsequent processing steps, and no RF power need be applied to any one of the electrodes during those steps or purges. A temperature regulator may be provided in a lower stage (402), i.e. the lower electrode. A substrate (401) is placed thereon and its temperature is kept constant at a given temperature. The upper electrode (404) can serve as a shower plate as well, and various gasses such as a plasma gas, a reactant gas and/or a dilution gas, if any, as well as a precursor gas can be introduced into the reaction chamber (403) through a gas line (421) and a gas line (422), respectively, and through the shower plate (404). Additionally, in the reaction chamber (403), a circular duct (413) with an exhaust line (417) is provided, through which the gas in the interior (411) of the reaction chamber (403) is exhausted. Additionally, a transfer chamber (405) is disposed below the reaction chamber (403) and is provided with a gas seal line (424) to introduce seal gas into the interior (411) of the reaction chamber (403) via the interior (416) of the transfer chamber (405) wherein a separation plate (414) for separating the reaction zone and the transfer zone is provided.

Note that a gate valve through which a wafer may be transferred into or from the transfer chamber (405) is omitted from this figure. The transfer chamber is also provided with an exhaust line (406).

Figure 5:
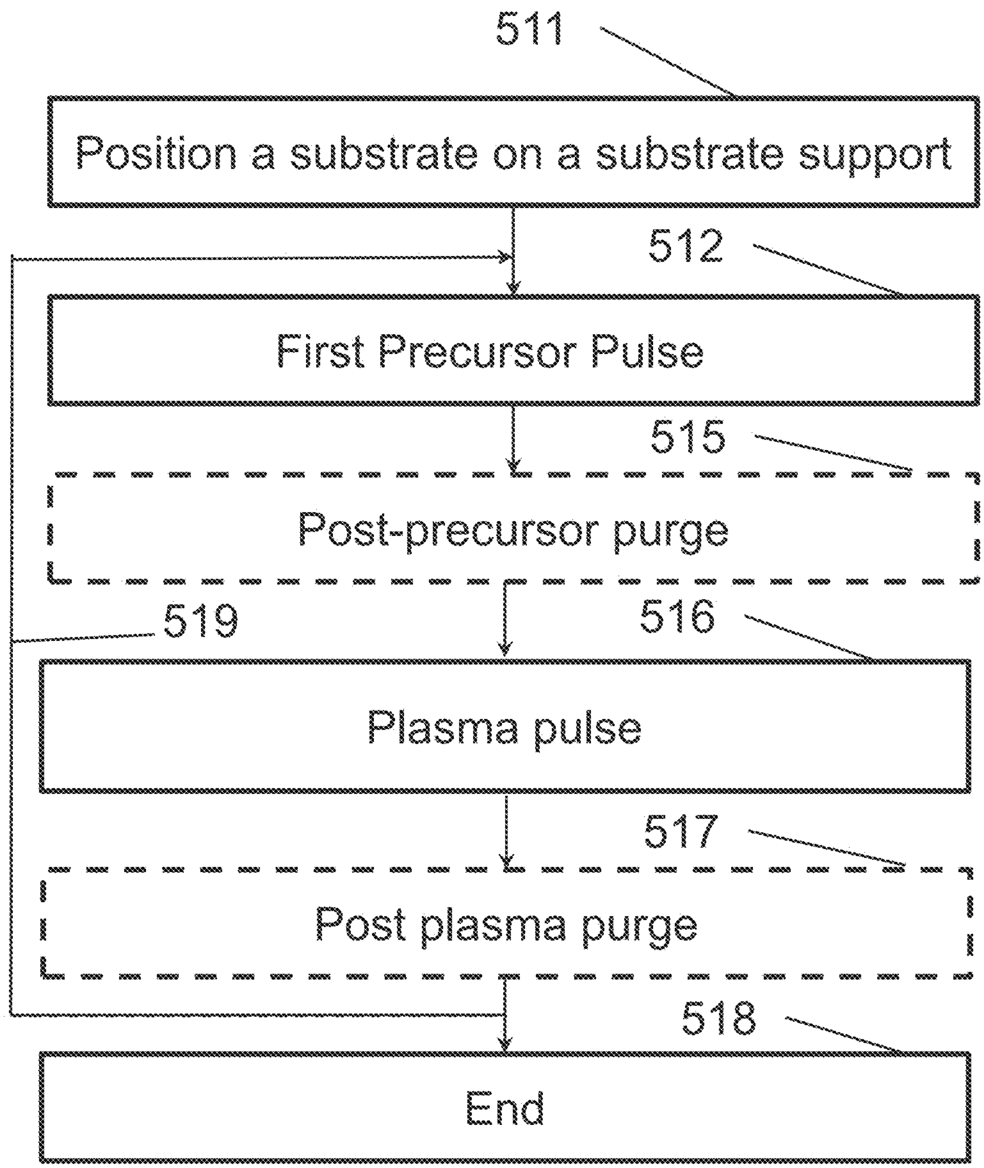
FIG. 5 shows a schematic representation of an embodiment of a method as described herein.

FIG. 5 shows a schematic representation of an embodiment of a method as described herein. The method comprises a step (511) of positioning a substrate on a substrate support. Then, the method comprises sequentially executing a plurality of deposition cycles (519). A deposition cycle (519) comprises a first precursor pulse (512) and a plasma pulse (516). The first precursor pulse (512) comprises exposing the substrate to a first precursor (512). The plasma pulse (516) comprises exposing the substrate to plasma-generated active species. The active species can be generated using a remote, direct, or indirect plasma configuration as explained elsewhere herein. It shall be understood that a first precursor pulse (512) and a plasma pulse (516) do not overlap, or do not substantially overlap. In other words, the first precursor pulse (512) and the plasma pulse (516) are carried out sequentially. In some embodiments, the first precursor pulse (512) and the plasma pulse (516) do at least partially overlap. In some embodiments, the precursor pulses (512) and the plasma pulses (516) are separated by purges (515,

517). In other words, in some embodiments, the first precursor pulse (512) is followed by a post-precursor purge (515), and the plasma pulse (516) is followed by a post-plasma purge (517). Purging can be done, for example, by exposing the substrate to a noble gas. Exemplary noble gasses include He, Ne, Ar, Xe, and Kr. Thus, a silicon-containing material is formed on the substrate. When a desired amount of silicon-containing material has been formed on the substrate, the method ends (518).

Figure 6:
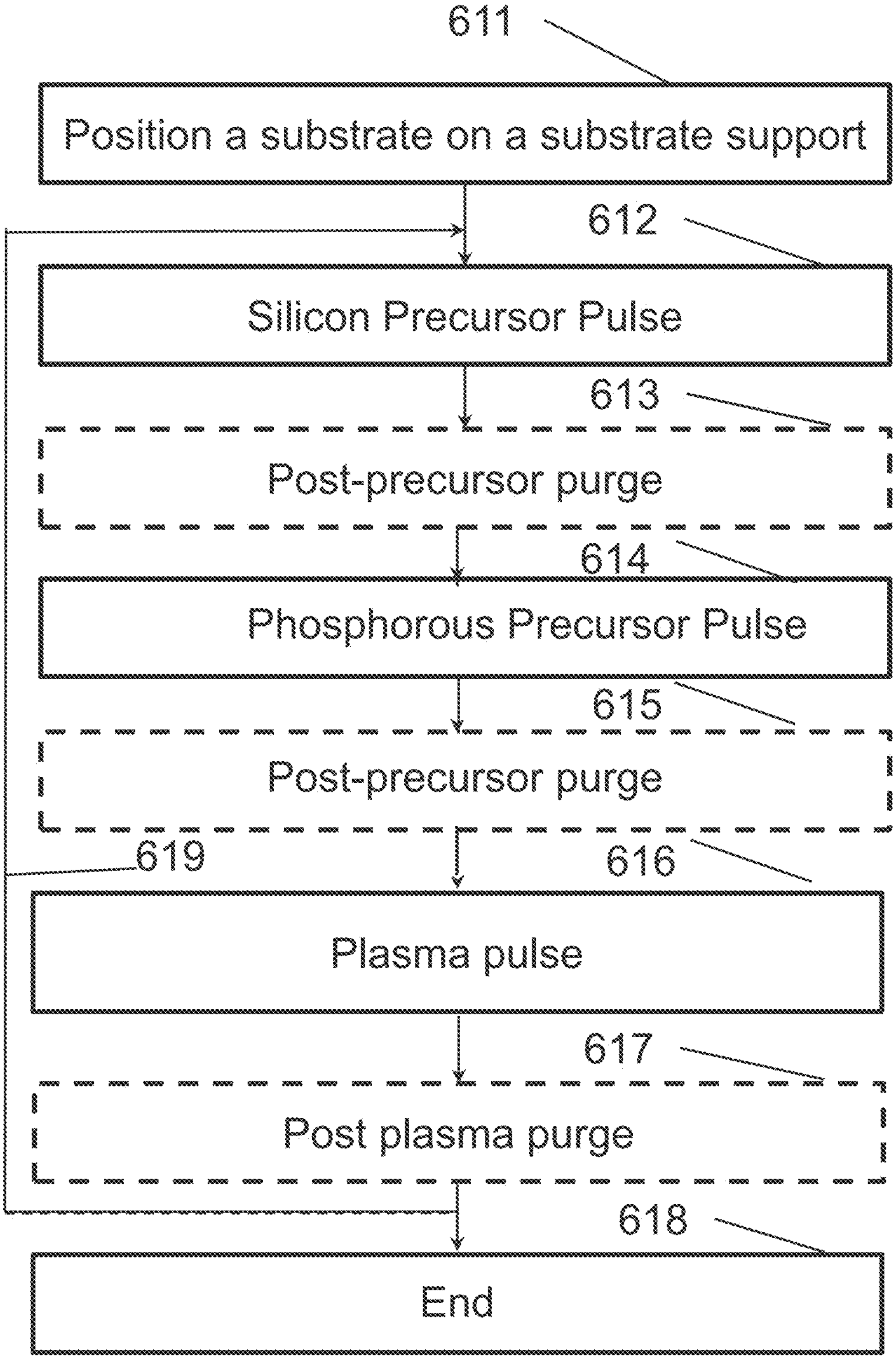
FIG. 6 shows a schematic representation of an embodiment of a method as described herein.

FIG. 6 shows a schematic representation of an embodiment of a method as described herein. The method comprises a step (611) of positioning a substrate on a substrate support. Then, the method comprises sequentially executing a plurality of deposition cycles (619). A deposition cycle (619) comprises a silicon precursor pulse (612), a phosphorus precursor pulse (614) and a plasma pulse (616). It is to be understood that each one of the pulses may be executed in whatever order. In other words, the cycle (619) may begin with a silicon precursor pulse (612), followed by a phosphorus precursor pulse (614) and finally a plasma pulse (616). Or the cycle (619) may begin with a phosphorus pulse (614), followed by a silicon precursor pulse (612) and finally a plasma pulse (616). The cycle may also include a plasma pulse after each precursor pulse. The cycle (61) may then begin with a silicon precursor pulse (612), followed by a plasma pulse (616), followed by a phosphorus precursor pulse (614) and finally a second plasma pulse (616). Or the cycle (619) may begin with a phosphorus pulse (614), followed by a plasma pulse (616), followed by a silicon precursor pulse (612) and finally a second plasma pulse (616).

The silicon precursor pulse (612) comprises exposing the substrate to a silicon precursor (612). The phosphorus precursor pulse (614) comprises exposing the substrate to a phosphorus precursor (614). The plasma pulse (616) comprises exposing the substrate to plasma-generated active species. The active species can be generated using a remote, direct, or indirect plasma configuration as explained elsewhere herein. It shall be understood that a silicon precursor pulse (612), phosphorus precursor pulse (614) and a plasma pulse (616) do not overlap, or do not substantially overlap. In other words, the silicon precursor pulse (612), the phosphorus precursor pulse (614) and the plasma pulse (616) are carried out sequentially. In some embodiments, the precursor pulses (612, 614) and the plasma pulses (616) are separated by purges (613, 615, 617). In other words, in some embodiments, the silicon precursor pulse (612) is followed by a post-precursor purge (613), the phosphorus precursor pulse (614) is followed by a post-precursor purge (615) and the plasma pulse (616) is followed by a post-plasma purge (617). Purging can be done, for example, by exposing the substrate to a noble gas. Exemplary noble gasses include He, Ne, Ar, Xe, and Kr. In some embodiments, the silicon precursor pulse (612), the phosphorus precursor pulse (614) and the plasma pulse (616) do at least partially overlap. Thus, a silicon-containing material is formed on the substrate. When a desired amount of silicon-containing material has been formed on the substrate, the method ends (618).

Figure 7:
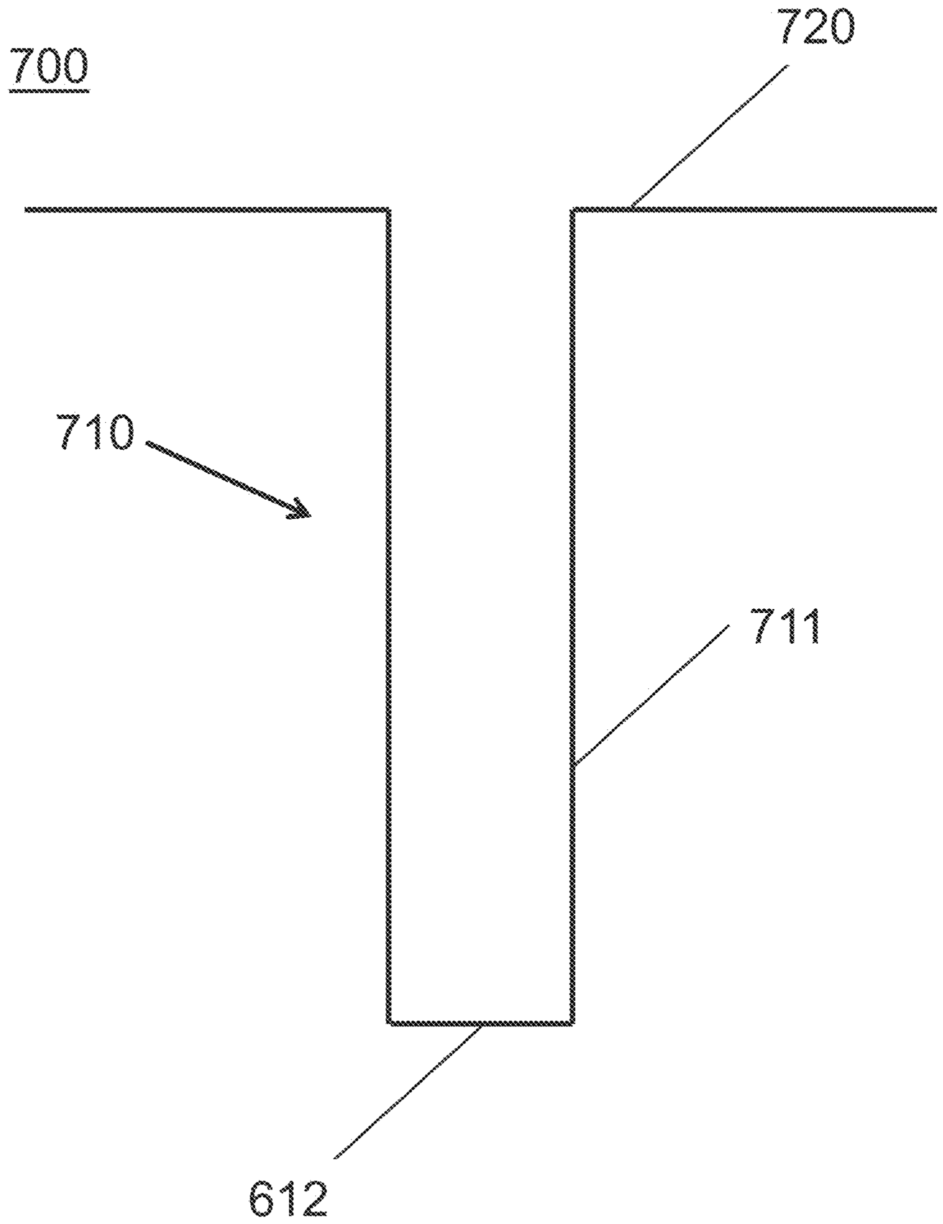
FIG. 7 shows a schematic representation of a substrate comprising a gap.

FIG. 7 shows a schematic representation of a substrate (700) comprising a gap (7710). The gap (710) comprises a sidewall (711) and a distal end (712). The substrate further comprises a proximal surface (720), i.e. a surface of the substrate outside of the gap. In some embodiments, the sidewall (711) and the distal end (712) comprise the same material. In some embodiments, at least one of the sidewall (711) and the distal end (712) comprise a dielectric, such as a silicon containing dielectric such as silicon oxide, silicon nitride, silicon carbide, and mixtures thereof. In some embodiments, the dielectric comprises hydrogen. In some embodiments, at least one of the sidewall (711) and the distal end (712) comprise a metal such as a transition metal, a post transition metal, and a rare earth metal. In some embodiments, the metal comprises Cu, Co, W, Ru, Mo, Al, or an alloy thereof.

In some embodiments, the sidewall (711) and the distal end (712) have an identical, or a substantially identical, composition. In some embodiments, the sidewall (711) and the distal end (712) have a different composition. In some embodiments, the sidewall and the distal end (712) comprise a dielectric. In some embodiments, the sidewall (711) and the distal end (712) comprise a metal. In some embodiments, the sidewall (711) comprises a metal and the distal end (712) comprises a dielectric. In some embodiments, the sidewall (711) comprises a dielectric and the distal end comprises a metal.

In some embodiments, the proximal surface (720) has the same composition as the sidewall (711). In some embodiments, the proximal surface (720) has a different composition than the sidewall (711). In some embodiments, the proximal surface (720) has a different composition than the distal end (712). In some embodiments, the proximal surface (720) has the same composition as the distal end (712).

In some embodiments, the proximal surface (720), the sidewall (711), and the distal end (712) comprise the same material. In some embodiments, the proximal surface (720), the sidewall (711), and the distal end (712) comprise a dielectric. In some embodiments, the proximal surface (720), the sidewall (711), and the distal end (712) comprise a metal. In some embodiments, the proximal surface (720), the sidewall (711), and the distal end (712) comprise a semiconductor.

In some embodiments, a layer formed in accordance with an embodiment of this disclosure has a step coverage of at least 90% to at most 110%, or of at least 95% to at most 105%, or of at least 99% to at most 101%, or of about 100%, in/on structures such as gaps (710) having aspect ratios (height/width) of more than about 2, more than about 5, more than about 10, more than about 25, more than about 50, more than about 100, or between about 10 and 100 or about 5 to about 25. It shall be understood that the term "step coverage" refers to the growth rate of a layer on a distal end (712) of a recess, divided by the growth rate of that layer on a proximal surface (720), and expressed as a percentage.

The illustrations presented herein are not meant to be actual views of any particular material, structure, or device, but are merely idealized representations that are used to describe embodiments of the disclosure.

The particular implementations shown and described are illustrative of the invention and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A composition comprising trisilylphosphine, wherein the composition has a purity of less than 99.99 (w/w %) of trisilylphosphine and wherein the composition comprises:

from about 0.01 wt-% to about 10 wt-% species impurity, and wherein the species impurity is at least one species impurity selected from the group consisting of $P(SiMe_3)_3$, $SiHMe_3$, $P(SiH_3)(SiMe_3)_2$, $PCl_3$, $PH(SiH_3)_2$, $PH_2(SiH_3)$, $PH(SiMe_3)_2$, and $PH_2(SiMe_3)$, and from about 0.01 wt-% to about 10 wt-% solvent as impurity, and wherein the solvent impurity is at least one solvent selected from the group consisting of cyclohexane, diethyl ether, methyl tert-butyl ether, tetrahydrofuran, 1,4-dioxane, acetonitrile, chloroform, dichloromethane, carbon tetrachloride, triethyl amine, pyridine, ethyl acetate, 1,2-dimethoxyethane, dimethyl sulfoxide, 1,2-dichloroethane, chlorobenzene, acetone, and 2-butanone, and wherein the composition does not comprise a silyl chloride.

2. The composition according to claim 1, wherein the composition comprises at least one species impurity selected from the group consisting of $P(SiMe_3)_3$, $SiHMe_3$, $PCl_3$, $PH(SiH_3)_2$, $PH_2(SiH_3)$, $PH(SiMe_3)_2$, and $PH_2(SiMe_3)$.

3. The composition according to claim 1, wherein the composition further comprises from about 0.01 wt-% to about 10 wt-% oxygen-containing species impurities, and wherein the oxygen-containing species impurities are selected from the group consisting of $P(OSiMe_3)_x(SiMe_3)_y$, $P(OSiMe_3)_x(SiH_3)_y$, $P(OSiH_3)_x(SiH_3)_y$, and $P(OSiH_3)_x(SiMe_3)_y$, where x=1 to 3 and where x+y=3.

4. The composition according to claim 1, wherein the composition further comprises from about 0.01 wt-% to about 10 wt-% oxygen-containing species impurities, and wherein the oxygen-containing species impurities are selected from the group consisting of $PH_x(OSiMe_3)_y(SiMe_3)_z$, $PH_x(OSiMe_3)_y(SiH_3)_z$, $PH_x(OSiH_3)_y(SiH_3)_z$, and $PH_x(OSiH_3)_y(SiMe_3)_z$, where x=1 or 2, and where y=1 or 2, where z=0 or 1, and where x+y+Z=3.

5. The composition according to claim 1, wherein the composition further comprises from about 0.01 wt-% to about 10 wt-% oxygen-containing species impurities, and wherein the oxygen-containing species impurities are selected from the group consisting of $P(Hal)_x(OSiMe_3)_y(SiMe_3)_z$, $P(Hal)_x(OSiMe_3)_y(SiH_3)_z$, $P(Hal)_x(OSiH_3)_y(SiH_3)_z$, and $P(Hal)_x(OSiH_3)_y(SiMe_3)_z$, where x=1 or 2, and where y=1 or 2, where z=0 or 1, and where x+y+z=3, and where "Hal" is a halogen substituent selected from F, Cl, Br, and I.

6. The composition according to claim 1, wherein the composition further comprises more than about 100 ppb of moisture as impurity.

7. The composition according to claim 1, wherein the composition comprises at least two species impurities selected from the group consisting of $P(SiMe_3)_3$, $SiHMe_3$, $P(SiH_3)(SiMe_3)_2$, $PCl_3$, $PH(SiH_3)_2$, $PH_2(SiH_3)$, $PH(SiMe_3)_2$, and $PH_2(SiMe_3)$.

8. A composition comprising trisilylphosphine, wherein the composition has a purity of less than 99.99 (w/w %) of trisilylphosphine and wherein the composition comprises:

from about 0.01 wt-% to about 10 wt-% species impurity, and wherein the species impurity is at least one species impurity selected from the group consisting of $P(SiMe_3)_3$, $SiHMe_3$, $P(SiH_3)(SiMe_3)_2$, [$PCl_3$, $PH(SiH_3)_2$, $PH_2(SiH_3)$, $PH(SiMe_3)_2$, and $PH_2(SiMe_3)$, and from about 0.01 wt-% to about 10 wt-% solvent as impurity, and wherein the solvent impurity is at least one solvent selected from the group consisting of cyclohexane, diethyl ether, methyl tert-butyl ether, tetrahydrofuran, 1,4-dioxane, acetonitrile, chloroform, dichloromethane, carbon tetrachloride, triethyl amine, pyridine, ethyl acetate, 1,2-dimethoxyethane, dimethyl sulfoxide, 1,2-dichloroethane, chlorobenzene, acetone, and 2-butanone, and further comprises from about 0.01 wt-% to about 10 wt-% chlorine-containing species impurity, and wherein the chlorine-containing species impurity is at least one species impurity selected from the group consisting of $PCl_3$, $SiH_3Cl$, $SiH_2Cl_2$, $SiHCl_3$, and $SiCl_4$.

9. The composition according to claim 3, wherein the composition comprises at least one species impurity selected from the group consisting of $P(SiMe_3)_3$, $SiHMe_3$, $PCl_3$, $PH(SiH_3)_2$, $PH_2(SiH_3)$, $PH(SiMe_3)_2$, and $PH_2(SiMe_3)$.

10. The composition according to claim 3, wherein the composition comprises at least two species impurities selected from the group consisting of $P(SiMe_3)_3$, $SiHMe_3$, $P(SiH_3)(SiMe_3)_2$, $PCl_3$, $PH(SiH_3)_2$, $PH_2(SiH_3)$, $PH(SiMe_3)_2$, and $PH_2(SiMe_3)$.

11. The composition according to claim 4, wherein the composition comprises at least one species impurity selected from the group consisting of $P(SiMe_3)_3$, $SiHMe_3$, $PCl_3$, $PH(SiH_3)_2$, $PH_2(SiH_3)$, $PH(SiMe_3)_2$, and $PH_2(SiMe_3)$.

12. The composition according to claim 4, wherein the composition comprises at least two species impurities selected from the group consisting of $P(SiMe_3)_3$, $SiHMe_3$, $P(SiH_3)(SiMe_3)_2$, $PCl_3$, $PH(SiH_3)_2$, $PH_2(SiH_3)$, $PH(SiMe_3)_2$, and $PH_2(SiMe_3)$.

13. The composition according to claim 5, wherein the composition comprises at least one species impurity selected from the group consisting of $P(SiMe_3)_3$, $SiHMe_3$, $PCl_3$, $PH(SiH_3)_2$, $PH_2(SiH_3)$, $PH(SiMe_3)_2$, and $PH_2(SiMe_3)$.

14. The composition according to claim 5, wherein the composition comprises at least two species impurities selected from the group consisting of $P(SiMe_3)_3$, $SiHMe_3$, $P(SiH_3)(SiMe_3)_2$, $PCl_3$, $PH(SiH_3)_2$, $PH_2(SiH_3)$, $PH(SiMe_3)_2$, and $PH_2(SiMe_3)$.

15. The composition according to claim 8, wherein the composition comprises at least one species impurity selected from the group consisting of $P(SiMe_3)_3$, $SiHMe_3$, $PH(SiH_3)_2$, $PH_2(SiH_3)$, $PH(SiMe_3)_2$, and $PH_2(SiMe_3)$.

16. The composition according to claim 8, wherein the composition comprises at least two chlorine-containing species impurities selected from the group consisting of $PCl_3$, $SiH_3Cl$, $SiH_2Cl_2$, $SiHCl_3$, and $SiCl_4$.

* * * * *